United States Patent
Hamada et al.

(10) Patent No.: US 8,854,725 B2
(45) Date of Patent: Oct. 7, 2014

(54) WAVELENGTH CONVERSION ELEMENT, METHOD OF MANUFACTURING THE SAME, AND LED ELEMENT AND SEMICONDUCTOR LASER LIGHT EMITTING DEVICE USING WAVELENGTH CONVERSION ELEMENT

(71) Applicant: Panasonic Corporation, Osaka (JP)

(72) Inventors: Takahiro Hamada, Osaka (JP); Nobuyasu Suzuki, Osaka (JP); Kenji Orita, Osaka (JP); Nobuaki Nagao, Gifu (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/070,882

(22) Filed: Nov. 4, 2013

(65) Prior Publication Data

US 2014/0071683 A1 Mar. 13, 2014

Related U.S. Application Data

(63) Continuation of application No. PCT/JP2013/003103, filed on May 15, 2013.

(30) Foreign Application Priority Data

May 16, 2012 (JP) ................. 2012-112163
May 17, 2012 (JP) ................. 2012-113250
May 22, 2012 (JP) ................. 2012-116188

(51) Int. Cl.
| | |
|---|---|
| *G02F 1/355* | (2006.01) |
| *H01L 33/50* | (2010.01) |
| *C09K 11/08* | (2006.01) |
| *G03B 21/14* | (2006.01) |
| *F21K 99/00* | (2010.01) |
| *H01S 5/022* | (2006.01) |
| *H01L 33/48* | (2010.01) |
| *H01S 5/00* | (2006.01) |

(52) U.S. Cl.
CPC .............. *F21K 9/56* (2013.01); *H01L 33/501* (2013.01); *H01L 2224/73265* (2013.01); *C09K 11/08* (2013.01); *H01S 5/02296* (2013.01); *H01L 2224/48091* (2013.01); *H01L 33/486* (2013.01); *H01L 33/502* (2013.01); *H01S 5/005* (2013.01); *G03B 21/14* (2013.01); *H01L 33/50* (2013.01)
USPC .......................................... 359/326; 359/332

(58) Field of Classification Search
USPC ................... 359/326–332; 362/259; 257/98
See application file for complete search history.

(56) References Cited

U.S. PATENT DOCUMENTS

| | | | |
|---|---|---|---|
| 5,998,925 A | 12/1999 | Shimizu et al. | |
| 7,208,768 B2 * | 4/2007 | Ono et al. | ........ 257/79 |

(Continued)

FOREIGN PATENT DOCUMENTS

| | | |
|---|---|---|
| JP | 04-338735 | 11/1992 |
| JP | 2004-315342 | 11/2004 |

(Continued)

OTHER PUBLICATIONS

Copending U.S. Appl. No. 14/080,500, filed Nov. 14, 2013.

(Continued)

*Primary Examiner* — Daniel Petkovsek
(74) *Attorney, Agent, or Firm* — Renner, Otto, Boisselle & Sklar, LLP

(57) ABSTRACT

A wavelength conversion element disclosed in the present application includes a phosphor layer including a plurality of phosphor particles and a matrix that is located among the plurality of phosphor particles and is formed of zinc oxide. The zinc oxide is columnar crystals or a single crystal in a c-axis orientation.

20 Claims, 24 Drawing Sheets

(56) References Cited

U.S. PATENT DOCUMENTS

| | | | |
|---|---|---|---|
| 7,442,568 B1* | 10/2008 | Ono et al. | 438/34 |
| 2009/0173957 A1* | 7/2009 | Brunner et al. | 257/98 |
| 2010/0283076 A1 | 11/2010 | Winkler et al. | |
| 2012/0098015 A1* | 4/2012 | Krauter | 257/98 |
| 2012/0326197 A1 | 12/2012 | Ohbayashi et al. | |
| 2014/0007921 A1* | 1/2014 | Kuramachi | 136/247 |

FOREIGN PATENT DOCUMENTS

| | | |
|---|---|---|
| JP | 2007-046002 | 2/2007 |
| JP | 2008-066365 | 3/2008 |
| JP | 2008-235744 | 10/2008 |
| JP | 2009-105125 | 5/2009 |
| JP | 2011-503266 | 1/2011 |
| JP | 2011-053323 | 3/2011 |
| JP | 2011-111506 | 6/2011 |
| JP | 2011-168627 | 9/2011 |
| JP | 2011-180353 | 9/2011 |
| WO | WO 2010/114172 | 10/2010 |
| WO | WO 2011/111293 | 9/2011 |

OTHER PUBLICATIONS

International Search Report for International Application No. PCT/JP2013/003103 mailed Jun. 18, 2013.

Hiroyo Segawa et al., "Fabrication of glasses of dispersed yellow oxynitride phosphor for white light-emitting diodes", Optical Materials, vol. 33, 2010, pp. 170-175.

Mingsong Wang et al., "Influence of annealing temperature on the structural and optical properties of sol-gel prepared ZnO thin films", Phys. Stat. Sol. (a), vol. 203, No. 10, 2006, pp. 2418-2425.

Jeong Rok Oh et al., "Enhanced forward efficiency of $Y_3Al_5O_{12}:Ce^{3+}$ phosphor from white light-emitting diodes using blue-pass yellow-reflection filter", Optics Express, vol. 17, Issue 9, 2009, pp. 7450-7457.

* cited by examiner

FIG.23A VOID

PHOSPHOR  ZnO (c-AXIS ORIENTATION)   1um

ZnO (c-AXIS ORIENTATION)  PHOSPHOR   1um

ZnO ROD
PHOSPHOR LAYER
GaN
THIN FILM OF ZINC OXIDE (SINGLE CRYSTAL)
SINGLE CRYSTALLINE ZnO
PHOSPHOR
TRACE IN WHICH PHOSPHOR WAS EMBEDDED

TRACE IN WHICH PHOSPHOR WAS EMBEDDED
SINGLE CRYSTALLINE ZnO
PHOSPHOR

WAVELENGTH CONVERSION ELEMENT, METHOD OF MANUFACTURING THE SAME, AND LED ELEMENT AND SEMICONDUCTOR LASER LIGHT EMITTING DEVICE USING WAVELENGTH CONVERSION ELEMENT

This is a continuation of International Application No. PCT/JP2013/003103, with an international filing date of May 15, 2013, which claims priorities of Japanese Patent Application No. 2012-112163, filed on May 16, 2012, Japanese Patent Application No. 2012-113250, filed, on May 17, 2012 and Japanese Patent Application No. 2012-116188, filed on May 22, 2012, the contents of which are hereby incorporated by reference.

BACKGROUND

1. Technical Field

The present application relates to a wavelength conversion element including phosphor particles and a method of manufacturing she some, and an LED element and a semiconductor laser light emitting device using the same.

2. Description of the Related Art

In recent years, a light emitting diode (LED) has come into use for lighting, and a higher-brightness and longer-life LED is desired to be developed. Conventionally, a wavelength conversion element including a phosphor layer for a white LED is forced by curing a resin mixture in which phosphor particles are mired with a silicone resin or the like. However, when a large current is passed through a high-brightness LED chip which is commercialized in recent years, the silicone resin is liable to be deteriorated by heat and high-brightness ultraviolet radiation generated from the LED chip. Therefore, as a matrix for forming a phosphor layer in which phosphor particles are dispersed, a matrix using not an organic substance such as a silicone resin which is liable to toe deteriorated by heat and ultraviolet radiation but an inorganic substance which is less liable to be deteriorated by heat and ultraviolet radiation is required to be realized.

International Patent Publication No. 2011/111293 discloses a phosphor layer in which, in order to improve the resistance to heat and the resistance to ultraviolet radiation of a silicone resin, phosphor particles carrying cerium oxide as a heat-resistant material are dispersed in the silicone resin.

Japanese Patent Translation Publication No. 2011-503266 (in particular, paragraph 0002) describes that a phosphor for an LED such as an yttrium aluminum garnet (YAG) phosphor or a terbium aluminum garnet (TAG) phosphor has a high refractive index of 1.7 or more, and that, in an LED, ordinarily, the phosphor is embedded in a silicone resin having a refractive index of 1.4 to form a phosphor layer, and thus, due to the refractive index difference (0.4) between the refractive index of the phosphor (1.8) and the refractive index of the silicone resin (1.4), a considerable ratio of light is scattered at an interface between the phosphor and the resin in the phosphor layer.

Japanese Patent Application Laid-Open Publication No. 2011-168627 (in particular, paragraph 0028 and paragraph 0032) discloses a technology in which, after a phosphor particle layer is formed on a substrate from a solution in which phosphor particles sire dispersed using electrophoresis, a light-transmitting substance to be an inorganic substance matrix is filled in voids in the phosphor particle layer using a sol-gel method. It is disclosed that the light-transmitting substance is preferably glass, and is a substance which is in a glass state and transmits light. Further, as combinations of phosphor particles and an inorganic matrix, examples such as a Ca-αSiAlON:Eu phosphor (refractive index 1.95 and silica (refractive index 1.45), a YAG phosphor (refractive index 1.8) and zinc oxide (refractive index 1.95) are disclosed.

Japanese Patent Application Lard-Open Publication No. 2008-66365 (in particular, paragraph 0003) discloses that, when a cavity in which phosphor particles and a light-transmitting material to be a matrix do not exist is caused in a phosphor layer, the existence of such a cavity attenuates light from the LED and light from the phosphor.

Japanese Patent Application Laid-Open Publication No. 2011-111506 (in particular, paragraph 0027) discloses that the refractive index of a phosphor whose composition is $CaAiSiN_3:Eu^{2+}$ is 2.0 and the refractive index of a phosphor whose composition is $CaSc_2O_4:Ce^{3+}$ is 1.9.

Non-Patent Document, Hiroyo Segawa et. al., Opt. Mater. 33 (2010) 170, discloses that SiAlON which is popularly used as phosphor particles in an LED has a refractive index in a range of 1.855 to 1.897 depending on the composition thereof.

SUMMARY

A conventional wavelength conversion element for a light emitting element is required to have higher optical output, higher resistance to heat, and higher resistance to ultraviolet radiation. Hon-limiting and exemplary embodiments of the present application provide a wavelength conversion element having high optical output, high resistance to heat, and nigh resistance to ultraviolet radiation, a method of manufacturing the same, and an LED element and a semiconductor laser light emitting device using the same.

A wavelength conversion element according to one embodiment of the present invention includes: a plurality of phosphor particles; and a matrix located among the plurality of phosphor particles and formed of zinc oxide in a c-axis orientation or single crystalline zinc oxide.

According to a technique disclosed in the present application, by using zinc oxide which is an inorganic matrix having a high refractive index, high resistance to heat, and high resistance to ultraviolet radiation, light scattering in a phosphor layer is reduced. Thus, the LED element, the semiconductor laser light emitting device, and the phosphor layer having high optical output can be realized.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIGS. 9A and 3B are sectional views of a wavelength conversion element and an LED element, respectively, in Embodiment 4.

FIGS. 23A and 23B are photographs of an image observed under a SEM of a section of a phosphor layer which is processed using a focused ion beam (FIB), and illustrate a phosphor layers in Example 2 and Example 1, respectively.

DETAILED DESCRIPTION

Figure 1:
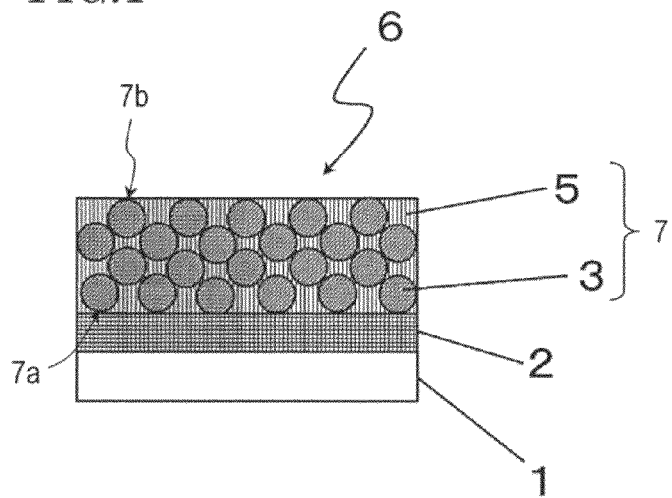
FIG. 1 is a sectional view of a wavelength conversion element, in Embodiment 1.

First, problems found by the inventors of the present application are described in detail.

In a phosphor layer including phosphor particles and a matrix such as a silicone resin for dispersing the phosphor particles therein, due to the refractive index difference (0.4 to 0.6) between the refractive index of a phosphor which is ordinarily used for an LED (1.8 to 2.0) and the refractive index of the silicone resin to be the matrix (1.4), light is scattered at an interface between the phosphor particles and the matrix. Therefore, light cannot be taken outside with efficiency.

Further, in order to realize a phosphor layer which is excellent in resistance to heat and resistance to ultraviolet radiation, a method has been proposed in which, as she matrix for forming the phosphor layer, a matrix using not an organic substance such as a silicone resin having low resistance to heat and low resistance to ultraviolet radiation but glass as an inorganic substance having high resistance to heat and nigh resistance to ultraviolet radiation is used (see, for example, Japanese Patent Application Laid-open Publication No. 2011-168627).

Glass is in a glass state (amorphous), and thus, has no grain boundary. Therefore, when glass is used as an inorganic matrix, light scattering clue to a grain boundary in the inorganic matrix in the phosphor layer is not caused. Further, glass is not crystalline and is an amorphous material, and thus, when used as an inorganic matrix, glass has a high degree of freedom in shape. For example, there is low-melting glass which is melted when heated to a low temperature and can freely change she shape thereof, and liquid glass which is in a liquid state at room temperature and can be cured by being heated.

However, when, in order to reduce the refractive index difference between the phosphor and the matrix, zinc oxide having a refractive index (2.0) which is higher than that of glass (refractive index 1.45) as an inorganic matrix, zinc oxide is crystalline, and thus, a grain boundary is formed. For example, zinc oxide formed lay a sol-gel method is an aggregation of microcrystals, and a polycrystal having random orientations (see, for example, Non-Patent Document, Mingsong Wang et. al., Phys. Stat. Sol. (a) 203/10 (2006) 2418). When a polycrystal having random orientations is formed in the phosphor layer, light from an LED chip and light from the phosphor excited by the light from the LED chip are scattered at the grain boundary. Such scattering is hereinafter referred to as light scattering in the phosphor layer. When the light scattering in the phosphor layer is caused, light scattered in the phosphor layer returns to the LED chip, to a package for fixing the LED chip, end the like to be absorbed therein, which causes a big problem that the ratio of light taken outside from an LED element is reduced.

Further, when a void remains in the phosphor layer, the void is usually filled with air. The refractive index of air is 1.0, which is significantly different from the refractive index of a phosphor that is ordinarily used for an LED (1.8 to 2.0) and the refractive index of the silicone ream (1.4). Therefore, a problem also arises that, due to the refractive index difference between the void and the phosphor and the refractive index difference between the void and the matrix, light is scattered in the phosphor layer.

When a silicone resin is used as the matrix in the phosphor layer, the phosphor layer can be formed by potting on the LED chip a mixture in which phosphor particles are dispersed in advance in the silicone resin, and curing the mixture by heating. In this case, the mixture can be deformed before being heated, and thus, by forming the phosphor layer after operation such as defoaming is sufficiently carried out, a void which remains in the phosphor layer can be inhibited.

On the other hand, when a matrix of an inorganic-substance whose shape is difficult to be freely controlled by molding or the like is used as the phosphor layers a phosphor particle layer formed of phosphor particles is formed in advance. Then, a raw material solution formed by dissolving a raw material (or a precursor) of the inorganic matrix in a solvent is filled in a space in the phosphor particle layer to form the inorganic matrix from, the raw material solution.

In this case, the inorganic matrix is formed by volatilizing of the solvent in the raw material solution. Therefore, (1) when the ratio of conversion from the raw material solution to the inorganic matrix per volume is small, the volume of the inorganic matrix converted in the space in the phosphor particle layer is smaller than the volume of the raw material solution filled in the space in the phosphor particle layer, and thus, a void is liable to be formed in the phosphor layer. (2) When, for the purpose of increasing the ratio of conversion from the raw material solution to the inorganic matrix per volume, the concentration of the raw material (or the precursor) is increased, the viscosity of the raw material solution is increased, and it becomes difficult to impregnate the void in the phosphor particle layer with the raw material solution. As a result, the raw material solution does not reach into every part of the void in the phosphor particle layer, and a void is liable to be formed in the phosphor layer.

Zinc oxide can be formed also by vacuum deposition such as electron beam deposition, reactive plasma deposition, sputtering, or pulse laser deposition. However, it is difficult to, for the purpose of forming the phosphor layer, cause zinc oxide formed by vacuum deposition to reach a void in the phosphor particle layer.

As described above, to use zinc oxide which has a high refractive index but has a low degree of freedom in shape and is crystalline as the inorganic matrix in the phosphor layer and not to form a grain boundary or a void in the phosphor layer are mutually contradictory.

In view of those problems, the inventors of the present application have arrived at a novel wavelength conversion element, a method of manufacturing the same, and an LED element and a semiconductor laser device using the wavelength conversion element.

In a wavelength conversion element according to one embodiment of the present invention, a thin film of zinc oxide (ZnO underlayer) is formed on a substrate and a phosphor particle layer formed of phosphor particles is formed on the ZnO underlayer. Further, spaces among phosphor particles are filled with zinc oxide which is crystal grown as a matrix in a c-axis orientation from the ZnO underlayer.

Zinc oxide which forms the matrix has a crystal structure of the wurtzite type. Zinc oxide in the c-axis orientation means that a plane thereof which is in parallel with the substrate is a c-plane. Further, according to the present invention, a substrate includes not only a so-called substrate such as a glass subs crate, a sapphire substrate, a gallium nitride (GaN) substrate but also a semiconductor light emitting element, a substrate of a semiconductor light emitting element, a surface of a thin film formed thereon, a principal plane of the phosphor layer, and the like.

Zinc oxide which, is crystal grown in the c-axis orientation becomes columnar crystals, and the number of the grain boundaries in the c-axis direction is small. Further, zinc oxide is crystal grown in the c-axis direction from the ZnO underlayer in the c-axis orientation formed on the substrate, and thus, columnar crystals with only a small number of grain boundaries can be arranged in a direction of light exiting from the LED chip, which is perpendicular to the substrate. Therefore, light scattering in the phosphor layer can be inhibited. The columnar crystals in the c-axis orientation mean that the growth of zinc oxide in the c-axis direction is faster than growth of zinc oxide in an a-axis direction and zinc oxide crystallites which are lengthwise long are formed with respect to the substrate. A crystallite means a minimum region which can be regarded as a single crystal in a polycrystal.

Further, by using a thin film of single crystalline zinc oxide which is epitaxially grown as ism. ZnO underlayer, spaces among phosphor particles can be filled with a matrix formed of single crystalline zinc oxide which is epitaxially grown from the ZnO underlayer. Single crystalline zinc oxide which is epitaxially grown has only a significantly small number of grain boundaries, and thus, light, scattering cue to grain boundaries in zinc oxide is not caused.

In a process of filling space in the phosphor particle layer with the matrix formed of zinc oxide in the c-axis orientation, solution growth is used. In solution growth, zinc oxide in the c-axis orientation can be grown by using a solution containing Zn ions as a raw material solution and using the ZnO underlayer as a seed crystal to be a nucleus of the crystal growth of the zinc oxide. The raw material solution is a diluted aqueous solution, and thus, the viscosity thereof is low. Therefore, the raw material solution can reach space in the phosphor particle layer with ease. Further, the crystal growth reaction of zinc oxide can be caused under a state in which the substrate having the phosphor particle layer formed thereon is soaked in the raw material solution. In addition, the raw material for growing zinc oxide is Zn ions, and thus, even when Zn ions are consumed by the crystal growth of zinc oxide, Zn ions diffuse from the raw material solution outside the phosphor particle layer to reach the inside of the phosphor particle layer with ease. Therefore, formation of a void in spaces among phosphor particles due to lack of the raw material can be inhibited. Further, as described in the following, in solution growth, zinc oxide is crystal grown not from a surface of the phosphor but from the ZnO underlayer, and thus, a void is not confined in the phosphor layer and a void in the phosphor layer can be inhibited.

A summary of a wavelength conversion element, a method of manufacturing the same, and an LED element and a semiconductor laser light emitting device using the wavelength conversion element according to one embodiment of the present invention is as follows.

A wavelength conversion element according to one embodiment of the present invention includes: a plurality of phosphor particles; and a matrix located among the plurality of phosphor particles and formed of zinc oxide in a c-axis orientation or single crystalline zinc oxide.

The wavelength conversion element may include a phosphor layer which includes the plurality of phosphor particles and the matrix.

A full width at half maximum (FWHM) of a c-axis of the zinc oxide using an X-ray rocking curve method may be 4° or less.

The wavelength conversion element may further include a thin film that is in contact with the phosphor layer and formed of zinc oxide.

The wavelength conversion element may further include a substrate that is in contact with the thin film, and the thin film may be located between the phosphor layer and the substrate.

The wavelength conversion element may further include a substrate that is in contact with the phosphor layer.

The substrate may be formed of one selected from the group consisting or glass, quarts, silicon oxide, sapphire, gallium nitride, and zinc oxide.

The zinc oxide may be columnar crystals.

The single crystalline zinc oxide may be in the c-axis orientation.

The plurality of phosphor particles may include at least one selected from the group consisting of an yttrium, aluminum garnet (TAG) phosphor and β-SiAlON.

An LED element according to one embodiment of the present invention includes: a semiconductor light emitting element for emitting excitation light; and any one of the above-mentioned wavelength conversion elements into which the excitation light emitted from the semiconductor light emitting element enters.

The wavelength conversion element may be directly formed on the semiconductor light emitting element.

The LED element may further include a crystal separation layer located between the wavelength conversion element and the semiconductor light emitting element.

The crystal separation layer may be formed of an amorphous material containing silicon dioxide as a main component.

The crystal separation layer may be formed by plasma-enhanced chemical vapor deposition.

The semiconductor light emitting element may include: an n-type GaN layer; a p-type GaN layer; and a light emitting layer formed of InGaN, the light emitting layer being sandwiched between the n-type GaN layer and the p-type GaN layer.

The excitation light may be light in a wavelength band of blue or blue-violet.

The plurality of phosphor particles may include a blue phosphor and a yellow phosphor, and the excitation light may be the light in the wavelength band of blue-violet. The blue phosphor may emit blue light by exciting the blue phosphor by the excitation light, and the yellow phosphor may emit yellow light by exciting the yellow phosphor by the excitation light or the blue light.

A semiconductor laser light emitting device according to one embodiment of the present invention includes: a semiconductor laser chip for emitting excitation light; and any one of the above-mentioned wavelength conversion elements into which the excitation light emitted from the semiconductor laser chip enters.

The excitation light may be light in a wavelength band of blue or blue-violet.

The plurality of phosphor particles may include a blue phosphor and a yellow phosphor, and the excitation light may be the light in the wavelength band of blue-violet. The blue phosphor may emit blue light by exulting the blue phosphor by the excitation light, and the yellow phosphor may emit yellow light by exciting the yellow phosphor by the excitation light or the blue light.

A vehicle according to one embodiment of the present invention includes: any one of the above-mentioned, semiconductor laser light emitting devices; and a power supply for supplying electric power to the semiconductor laser light emitting device.

A method, of manufacturing a wavelength conversion element according to one embodiment of the present invention, includes: a step (a) of forming, on a thin film of zinc oxide in a c-axis orientation, a phosphor particle layer including phosphor particles; and a step (b) of filling, with zinc oxide, spaces among phosphor particles using solution growth to form a phosphor layer.

A FWHM of a c-axis of the thin film, of zinc oxide using an X-ray rocking curve method may be 4.5° or less.

The shin film of zinc oxide may be an epitaxially grown single crystal.

The step of forming a phosphor particle layer may be electrophoresis.

The phosphor particles may include at least one selected from she group consisting of an yttrium aluminum garnet (YAG) phosphor and β-SiAlON.

The present structure can provide the wavelength conversion element in which light scattering in the phosphor layer occurs to a small extent, and the LED element and the semiconductor laser light emitting device which use the wavelength conversion element and which have high optical output.

Embodiments of the present invention are described in the following with reference to the drawings.

Embodiment 1

FIG. 1 is a sectional view of a wavelength conversion element of Embodiment 1.

A wavelength conversion element 6 of this embodiment includes a phosphor layer 7 which itself includes a plurality of phosphor particles 3 and a matrix 5 located among the plurality of phosphor particles 3. The wavelength conversion element 6 converts at least a part of incident light info light in a wavelength band which is different from the wavelength band of the incident light and emits the converted light.

As the plurality of phosphor particles 3, a phosphor having various excitation wavelengths, exiting light wavelengths, and particle diameters ordinarily used for a light emitting element can be used. For example, YAG (yttrium aluminum garnet), β-SiAlON, or she like can be used. In particular, the wavelength for exciting the phosphor and the wavelength of exiting light can be arbitrarily selected in accordance with the use of the wavelength conversion element 6. Further, in accordance with those wavelengths, an element with which YAG or β-SiAlON is doped can be selected.

In particular, when blue-violet light or blue light is selected as the wavelength of excitation light for exciting the phosphor layer 7, the phosphor can be excited with efficiency, and thus, a light emitting element or a light emitting device such as a high output FED element or a high output semiconductor laser light emitting device can be realized.

Blue-violet light emitted from, the light emitting element may excite a blue phosphor, and the generated blue light may be used to excite the phosphor particles 3 in the wavelength conversion element 6. Therefore, blue light which enters the wavelength conversion element 6 includes blue light from the blue phosphor.

When a yellow phosphor which is excited by nine light is used as the phosphor particles 3, light emitted from the wavelength conversion element 6 is white light which is composite light of blue light as the excitation light and yellow light from the phosphor. In this case, light having a wavelength of 400 nm to 420 nm is defined as blue-violet light, and light having a wavelength of 420 nm to 470 nm is defined as blue light. Further, light having a wavelength of 500 nm to 700 nm is defined as yellow light. A blue phosphor is a definition of a phosphor which is excited by blue-violet light and which emits blue light. Further, a yellow phosphor is a definition of a phosphor which is excited by blue light or blue-violet light and emits yellow light.

As the phosphor particles 3, both a blue phosphor which is excited by blue-violet light and a yellow phosphor which is excited by blue light may also be used. In this case, also, the wavelength conversion element 6 emits white light which is composite light of blue light and yellow light from the phosphors. Alternatively, as the phosphor particles 3, both a blue phosphor which is excited by blue-violet light and a yellow phosphor which is excited by blue-violet light may also be used. In this case, also, the wavelength conversion element 6 emits white light which is composite light of blue light and yellow light, from the phosphors.

Further, for the purpose of enhancing the color rendering of the LSD element and the semiconductor laser light emitting device, a phosphor which emits green light or a phosphor which emits red light may also be used together. The matrix 5 is formed of zinc oxide in the c-axis orientation. Here specifically, zinc oxide in the c-axis orientation is columnar crystals or a single crystal having a crystal structure of the wurtzite type. As illustrated in FIG. 1 by schematic lines, the c-axis of zinc oxide in the matrix 5 is in parallel with the direction of the normal to a substrate 1, or, the c-axis is tilted by 4° or less with respect to the direction of the normal to the substrate 1. In this case, "the c-axis is tilted by 4° or less" means that the distribution of tilts of the c-axis is 4° or less, and does not necessarily mean that all the tilts of the crystallites are 4° or less, "The tilt of the c-axis" can be evaluated by the FWHM of the c-axis using an X-ray rocking curve method. As described above, columnar crystals in the c-axis orientation have only a small number of grain boundaries in the c-axis direction.

In this embodiment, the phosphor particles 3 are in contact with one another in the phosphor layer 7. The matrix 5 is filled in spaces among the phosphor particles 3, and the matrix 5 and the phosphor particles 3 are in contact with one another. In other words, the phosphor particles 3 are in contact with adjacent phosphor particles 3, and are, at the same time, in contact with the matrix 5. Further, substantially no void exists in the phosphor layer 7.

The matrix 5 formed of zinc oxide in the c-axis orientation is formed using crystal growth property of zinc oxide. Therefore, the wavelength conversion element 6 may further include the substrate 1 and a thin film 2. The thin film 2 is in contact with, for example, a principal plane 7a of the phosphor layer 7. Further, the substrate 1 is in contact with the thin film 2, and the thin film 2 is located, between the substrate 1 and the phosphor layer 7.

As described above, the substrate 1 is formed of one selected from the group consisting of glass, quartz, silicon oxide, sapphire, gallium nitride, end zinc oxide. When the substrate 1 formed of sapphire or gallium nitride is used, the principal plane of the substrate 1 may be the c-plane of those crystals. The thin film 2 is formed of single crystalline zinc oxide or polycrystalline zinc oxide.

The thin film 2 functions as a seed crystal to be a nucleus of the crystal growth of zinc oxide which forms the matrix 5, and thus, the above-mentioned matrix 5 of zinc oxide in the c-axis orientation can be formed.

The substrate 1 and the thin film 2 may be removed after the matrix 5 is formed. The wavelength conversion element 6 is not necessarily required to include the substrate 1 or both the substrate 1 and the thin film 2. Further, insofar as zinc oxide in the c-axis orientation can be directly formed on the substrate 1, the wavelength conversion element 6 may include the substrate 1 and may not include the thin film 2. With regard to zinc oxide in the c-axis orientation when the substrate 1 is removed, the c-axis of zinc oxide in the matrix 5 is in parallel with the direction of the normal to the principal plane 7a or a principal plane 7b of the phosphor layer 7, or, the c-axis is tilted by 4° or less with respect to the direction of the normal to the principal plane 7a or 7b of the phosphor layer 7. Specifically, when the FWHM of the c-axis using the X-ray rocking curve method is 4° or less, zinc oxide having only a small number of grain boundaries in the c-axis direction can be formed.

According to the wavelength conversion element of this embodiment, the matrix formed of zinc oxide fills in space among the phosphor particles, and thus, the resistance to heat is high. Further, the refractive index of zinc oxide is high, and thus, scattering of light which enters the wavelength conversion element is inhibited on surfaces of the phosphor particles, and light can be taken outside with efficiency.

A method of manufacturing the wavelength conversion element 6 according to this embodiment is described in the following with reference to the drawings.

Figure 2A:
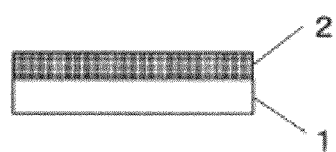
FIGS. 2A to 2C are sectional views illustrating a method of manufacturing the wavelength conversion element in Embodiment 1 in the order of process.
Figure 2C:
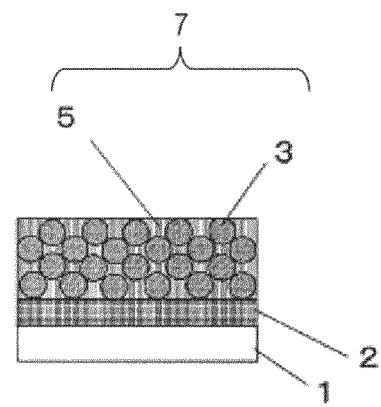
Figure 2B:
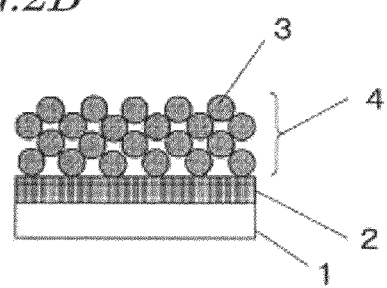

FIGS. 2A, 2B, and 2C are sectional views illustrating the method according to Embodiment 1 in she order of process.

In Embodiment 1, the voids in a phosphor particle layer 4 formed of the phosphor particles 3 are filled with the matrix 5 formed of zinc oxide in the c-axis orientation which is crystal grown from the thin film 2 of zinc oxide.

First, as illustrated in FIG. 2A, the thin film 2 of zinc oxide is formed on the substrate 1. As the substrate 1, a highly transparent substrate may be used. A glass substrate, a quartz substrate, or the like can be used. A polyethylene naphthalate (PEN) film, a polyethylene terephalate (PET) film, or the like may also be used.

When the substrate 1 used is formed of an amorphous material which does not have a crystal structure such as glass, or, when the substrate 1 used is a single crystalline substrate but the lattice mismatch ratio between the crystal structure of the substrate and the crystal structure of zinc oxide is high, the thin film 2 is formed of polycrystalline zinc oxide.

As the method of forming the thin film 2 of zinc oxide, vacuum deposition such as electron beam deposition, reactive plasma deposition, sputtering, or pulse laser deposition is used. In vacuum, deposition, the thin film 2 of zinc oxide in the c-axis orientation can be formed in accordance with film forming conditions such as the substrate temperature and the plasma density when the film is formed, annealing treatment after the film formation, and the like. Further, for tine purpose of obtaining the thin film 2 of zinc oxide in the c-axis orientation, having a low electrical resistance, the thin film of zinc oxide may be doped with an element such as Ga, Al, or B.

Then, as illustrated in FIG. 2B, the phosphor particle layer 4 formed of the phosphor particles 3 is formed on the thru film 2 of zinc oxide which itself is formed, on the substrate 1. With regard to the method of forming the phosphor particle layer 4, a phosphor dispersed solution in which the phosphor particles 3 are dispersed is prepared, and the phosphor particles 3 can be accumulated, on the thin film 2 of zinc oxide using electrophoresis. Alternatively, the phosphor particle layer 4 may be formed by settling the phosphor particles 3 in the phosphor dispersed solution.

Further, as illustrated in FIG. 2C, the matrix 5 formed of zinc oxide in the c-axis orientation can be crystal grown by solution growth using a solution containing Zn ions from the thin film 2 of zinc oxide in the c-axis orientation. As the solution growth, chemical bath deposition under atmospheric pressure, hydrothermal synthesis at pressures above atmospheric pressure, electrochemical deposition in which voltage or current, is applied, or the like is used. As the solution for the crystal growth, for example, an aqueous solution of zinc nitrate $(Zn(NO_3)_2)$ containing hexamethylenetetramine $(C_6H_{12}N_4)$ is used. Exemplary pH of the aqueous solution of zinc nitrate is 1 or more and 7 or less. Those kinds of solution growth are disclosed in, for example, Japanese Patent Application Laid-open do, 2004-315342.

Figure 3:
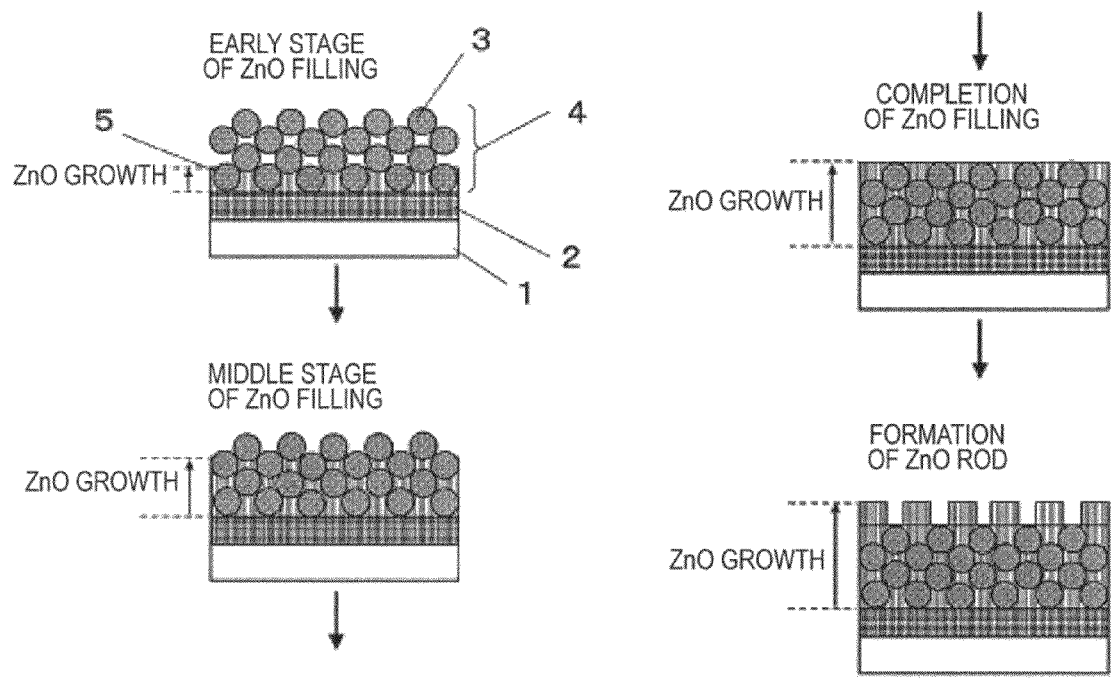
FIG. 3 is a sectional view illustrating a crystal growth process of zinc oxide using solution growth.

FIG. 3 illustrates a process midway through formation of the matrix 5 formed of zinc oxide in the c-axis orientation by crystal growth from the thin film 2 of zinc oxide in the c-axis orientation illustrated in FIG. 2C. By using solution growth, zinc oxide is not directly crystal grown from the phosphor particles 3 but zinc oxide in the c-axis orientation can be crystal grown upward in due order of succession from the thin film 2 formed below the phosphor particle layer 4 with the thin film 2 being the seed crystal. Note that, as illustrated in FIG. 3, zinc oxide is crystal grown through the voids in the phosphor particle layer, and thus, an uneven structure termed of rod-like zinc oxide which is grown from narrow gaps among the phosphor particles on the surface of the phosphor layer may be formed. In this case, reflection of light due to the refractive index difference between the phosphor layer and air can be reduced.

By forming the matrix 5 so as to fill in the voids in the phosphor layer 4, the phosphor layer is formed as illustrated in FIG. 2C. In this wavy the wavelength conversion element 6 is manufactured. As described above, after that, the substrate 1, or both the substrate 1 and the thin film 2 may be removed from the phosphor layer 7.

Embodiment 2

Figure 4:
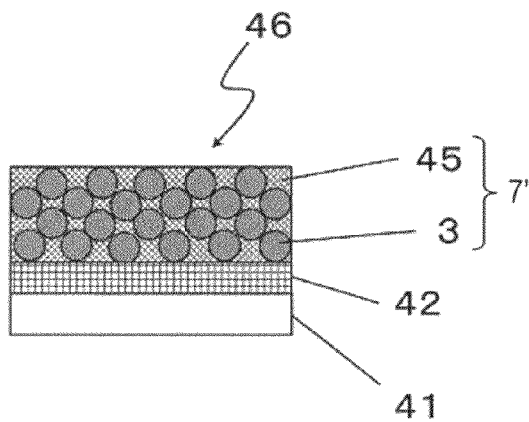
FIG. 4 is a sectional view of a wavelength conversion element in Embodiment 2.

FIG. 4 is a sectional view of a wavelength conversion element according to Embodiment 2.

A wavelength conversion element 46 according to this embodiment includes a substrate 41, a thin film 42, and a phosphor layer 7'. The substrate 41 is a single crystalline substrate, and the thin film 42 is termed of single crystalline zinc oxide. Further, in the phosphor layer 7', a matrix 45 is formed of single crystalline zinc oxide.

In Embodiment 2, voids in the phosphor particle layer 4 formed of the phosphor particles 3 are filled with single crystalline zinc oxide which is crystal grown from the thin film 42 of single crystalline zinc oxide.

According to the wavelength conversion element of this embodiment, the matrix 45 is formed of single crystalline zinc oxide, and thus, the number of the grain boundaries in the matrix 45 is further reduced so that scattering of light which enters the phosphor layer is further reduced. Therefore, the wavelength conversion element according to this embodiment can take out light to the outside with further efficiency.

A method of manufacturing the wavelength conversion element 46 according to this embodiment is described in the following with reference to the drawings.

Figure 5A:
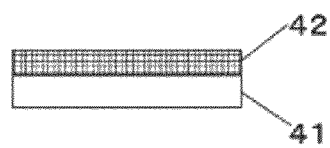
FIGS. 5A to 5C are sectional views illustrating a method of manufacturing the wavelength conversion element in Embodiment 2 in the order of process.
Figure 5C:
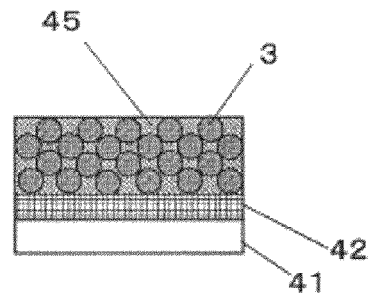
Figure 5B:
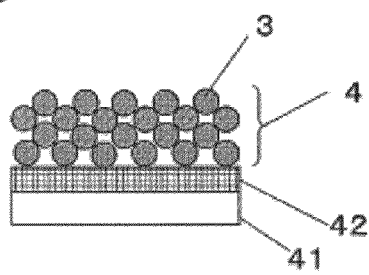

FIGS. 5A, 5B, and 5C are sectional views illustrating the method according to Embodiment 2 in the order of process.

As the substrate 41, a single crystalline substrate having a low lattice mismatch ratio between the crystal structure of zinc oxide and the crystal structure of the substrate is used. In this case, zinc oxide can be crystal grown with a predetermined relationship between the crystal orientation of the substrate 41 and the crystal orientation of the thin film 42 of zinc oxide. This growth is hereinafter referred to as epitaxial growth. In the thin film 42 of epitaxially grown zinc oxide, crystals are oriented in the same direction as a whole, and, except for a crystal detect and the like, basically no grain boundary is formed. In this way, a single crystal means a crystal which is epitaxially grown has a significantly small number of grain boundaries. As the substrate 41 on which the thin film 42 of single crystalline zinc oxide can be epitaxially grown, a sapphire substrate, a GaN substrate, a zinc oxide substrate, or the like can be used. As the substrate 41, the above-mentioned single crystalline substrate having a buffer layer formed thereon for alleviating the lattice mismatch ratio between the crystal structures of the substrate and zinc oxide may also be used. For example, as the substrate 41, a sapphire substrate having a single crystalline GaN thin film formed thereon may also be used.

As illustrated in FIG. 5A, the thin film 42 is formed on the substrate 41. As the method of forming the thin film 42 of single crystalline zinc oxide, vacuum deposition similar to that in Embodiment 1 is used. Further, when the surface of the substrate 41 can be a seed crystal of zinc oxide in solution growth, the thin film 42 of single crystalline zinc oxide may be formed by solution growth. For example, toe thin film 42 of single crystalline zinc oxide may be formed by solution growth on a sapphire substrate having a single crystalline GaN thin film formed thereon.

Then, as illustrated in FIG. 5E, the phosphor particle layer 4 formed of the phosphor particles 3 is formed on the thin film 42 of single crystalline zinc oxide which itself is formed on the substrate 41. As the method of forming the phosphor particle layer 4, a method similar to that in Embodiment 1 is used.

Further, as illustrated in FIG. 5C, the matrix 45 formed of single crystalline zinc oxide can be formed by solution growth using a solution containing Zn ions from the thin film 42 of single crystalline zinc oxide. In forming the matrix 45, a method similar to that in Embodiment 1 is used.

Embodiment 3

Figure 6A:
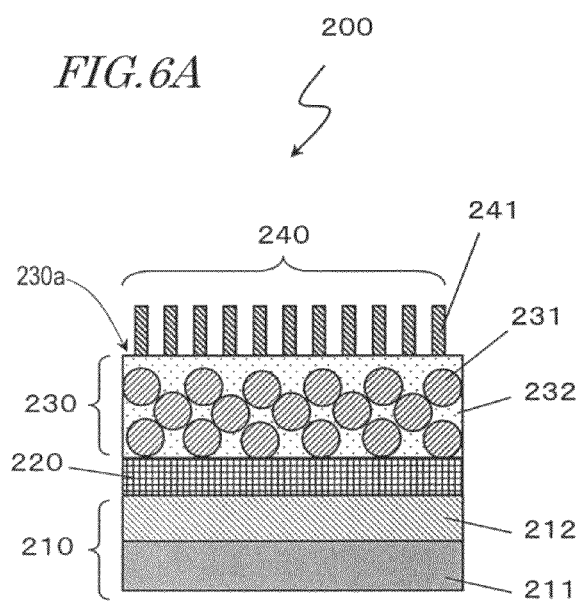
FIGS. 6A and 6B are a sectional view and a plan view of a two-dimensional periodic structure, respectively, of a wavelength conversion element in Embodiment 3.

FIG. 6A is a sectional view of a wavelength conversion element according to Embodiment 3.

A wavelength conversion element 200 according to this embodiment includes a substrate 210, a thin film 220, a phosphor layer 230, and a two-dimensional periodic structure 240. The substrate 210 includes a support 211 and a reflective layer 212. As the support 211, for the purpose of efficiently discharge heat generated in phosphor particles 231, a material having a high thermal conductivity such as a metal, for example, aluminum, or ceramic can be used. As the reflective layer 212, a material which reflects light of a visible wavelength including fluorescence can be used, and, from the viewpoint of discharging heat, a metal such as aluminum or sliver can be used.

The thin film 220 is, similarly to the cases of Embodiments 1 and 2, formed of polycrystalline or single crystalline zinc oxide.

The phosphor layer 230 includes, similarly to the cases of Embodiments 1 and 2, a matrix 232 located among the phosphor particles 231. The matrix 232 is formed of zinc oxide in the c-axis orientation.

The two-dimensional periodic structure 240 is provided on a principal plane 230a of the phosphor layer 230, and includes a plurality of rods 241. The plurality of rods 241 are formed of zinc oxide in the c-axis orientation.

Figure 6B:
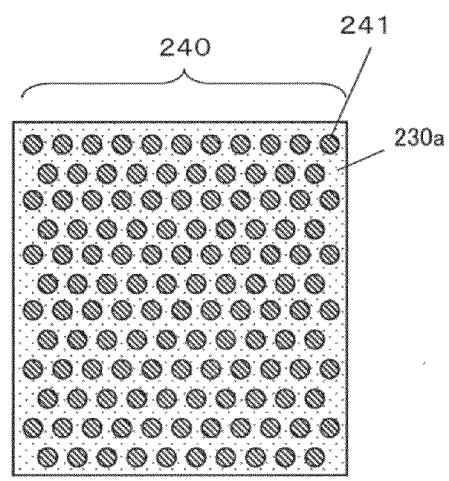

FIG. 6B illustrates an arrangement of the rods 241 of the two-dimensional periodic structure 240 on the principal plane 230a. The two-dimensional periodic structure 240 is formed by arranging the rods 241 in a triangular lattice.

According to the wavelength conversion element of this embodiment, the two-dimensional periodic structure provided on the phosphor layer functions as a two-dimensional diffraction grating, and the full width at half maximum of the distribution of radiation angle of fluorescence emitted from a surface of the phosphor layer on which the two-dimensional periodic structure is provided becomes smaller. In other words, the radiation angle of light emitted from the wavelength conversion element becomes smaller. Therefore, when light emitted from the wavelength conversion element is used via a lens, the light condensing efficiency by the lens is improved.

A method of manufacturing the wavelength conversion element 200 according to this embodiment is described in the following with reference to the drawings.

FIGS. 7A to 7G are sectional views illustrating the method for the wavelength conversion element 200 according to Embodiment 3 in the order of process.

Figure 7A:
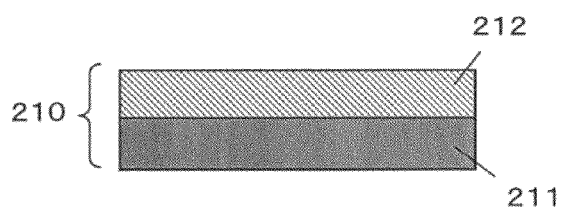
FIGS. 7A to 7G are sectional views illustrating a method of manufacturing the wavelength conversion element in Embodiment 3 in the order of process.

First, as illustrated in FIG. 7A, the reflective layer 212 is placed on the support 211 to obtain the substrate 210. As described above, as the support 211, for the purpose of efficiently discharge heat generated in the phosphor particles 231, a material having a high thermal conductivity such as a metal, for example, aluminum, or ceramic can be used. As the reflective layer 212, a material which reflects light of a visible wavelength including fluorescence can be used, but, from the viewpoint of discharging heat, a metal such as aluminum or silver can be used.

Figure 7B:
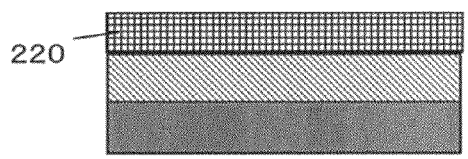

Then, as illustrated in FIG. 7B, the thin film 220 formed, of zinc oxide in the c-axis orientation is provided on the substrate 210. As the method of forming the thin film 220, vacuum deposition such as electron beam deposition, resistance heating deposition, reactive plasma deposition, sputtering, organic metal vapor deposition, molecular beam epitaxy, or pulse laser deposition is used. Further, as described above, solution growth using a solution containing Zn ions is also used. As the solution growth, chemical bath deposition under atmospheric pressure, hydrothermal synthesis at pressures above atmospheric pressure, electrochemical deposition in which voltage or current is applied, or the like is used. Zinc oxide is liable to grow along the c-axis, and thus, by controlling she film forming conditions such as the temperature and the film forming speed, the thin film 220 can be obtained with ease.

Note that, in order so obtain the thin film 220 having a low electrical resistance, zinc oxide which forms the thin film 220 may be doped with a dopant such as Ga, Al, In, or B.

Figure 7C:
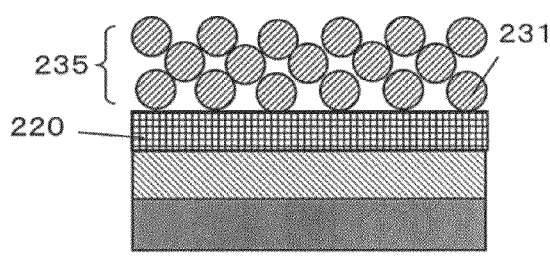

Then, as illustrated in FIG. 7C, a phosphor particle layer 235 formed of the phosphor particles 231 is formed on the thin film 220. With regard to the method of forming the phosphor particle layer 235, for example, the following technology can be used. Specifically, a phosphor dispersed solution in which the phosphor particles 231 are dispersed is used to accumulate the phosphor particles 231 on the thin film 220 by electrophoresis. Alternatively, the phosphor particle layer 235 may be formed by settling the phosphor particles 231 in the phosphor dispersed solution onto the thin film 220. Further, a method may be used in which the phosphor dispersed solution is applied onto the thin film 220 and then the solution is dried. No matter which of the methods is used, differently from the case of the conventional technology of forming a phosphor in which phosphor particles are dispersed in a matrix of a resin, according to the present invention, the phosphor particles 231 form an agglomerated structure in the phosphor particle layer 235 which is prepared. As a result, differently from the case of the conventional technology, dispersion in the matrix is not required to be controlled, and the amount of fluorescence can be controlled only by adjusting the amount of the phosphor particles 231. Therefore, a wavelength conversion element having stable fluorescence characterstics can be obtained with ease.

Figure 7D:
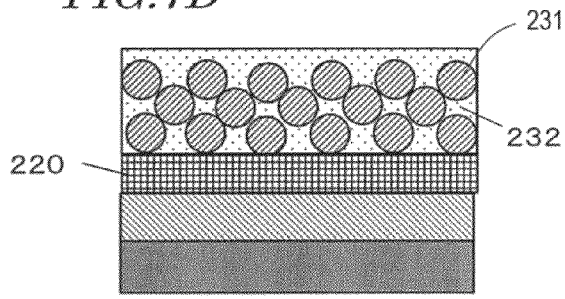

Then, as illustrated in FIG. 7D, by solution growth using a solution containing Zn ions, zinc oxide in the c-axis orientation, is crystal grown from the thin film 220 to fill spaces among the phosphor particles 231 with the matrix 232 formed or zinc oxide in the c-axis orientation. Chemical bath deposition or electrolytic deposition under atmospheric pressure, hydrothermal synthesis set pressures above atmospheric pressure, or the like is used. As the solution for the crystal growth, for example, a zinc nitrate solution containing hexamethylenetetramine is used. Exemplary pH of the zinc nitrate solution is 5 or more and 7 or less. Zinc oxide has a characteristic which other oxides do not have in that growth in a solution around the neutral point is possible as described above. Differently from the case of filling glass which requires an alkaline reaction liquid, solution growth of tine oxide around the neutral point does not cause non-light emitting recombination on surfaces of the phosphor particles 231 due to chemical etching, and thus, filling with the matrix 232 does not reduce the internal quantum efficiency of the phosphor particles 231.

By using solution growth, the matrix 232 of zinc oxide in the c-axis orientation can be crystal grown upward in due order of succession from the thin film 220 in a region below the phosphor particles 231 by using the thin film 220 as a nucleus of the crystal growth, that is, a seed crystal. As a result, zinc oxide which, forms the matrix 232 maintains the crystal state of the thin film 220 as the underlayer. Therefore, similarly to the thin film 220, the matrix 232 has a dense crystal structure.

The matrix 232 which is grown from the region below the phosphor particles 231 grows so as to fill the spaces among the phosphor particles 231, and then, is be nod also in a region above the phosphor particles 231 by lateral growth. Further, the raw material solution is a diluted aqueous solution and has a low viscosity, and thus, the raw material solution can reach the inside of the phosphor particle layer 235 with ease. Further, Zn ions which are the raw material for growing zinc oxide are small, and thus, even, when Zn ions are consumed by the crystal growth of the matrix 232, Zn ions can diffuse from the raw material, solution outside the phosphor particle layer 235 to reach the inside of the phosphor particle layer 235 with ease. Therefore, formation of a void in the phosphor layer 230 due to lack of the raw material can be inhibited.

Figure 7E:
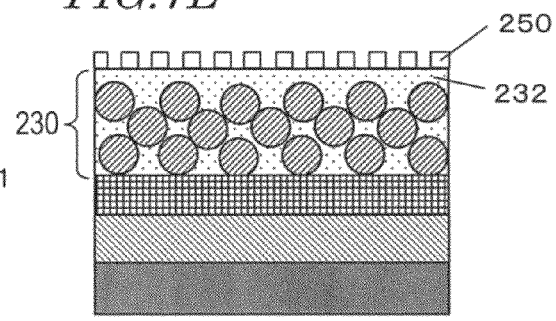

Then, as illustrated in FIG. 7E, a selective growth mask 250 formed of a resin such as a photoresist is provided on the matrix 232 of zinc oxide in the c-axis orientation. The selective growth mask 250 has a mask pattern in which openings where the surface of the matrix 232 formed of zinc oxide in the c-axis orientation thereunder is exposed are two-dimensionally and periodically arranged in a triangular lattice. In forming the selective growth mask 250, a technology in which a photoresist is applied onto the phosphor layer 230 and patterning is carried out by photolithography, electron beam exposure, or UV nanoimprint, a method in which the resin pattern is transferred by thermal nanoimprint, or the like can be used. Note that, for the purpose of facilitating fine patterning, pretreatment of the surface of the phosphor layer 230 such as planarizing treatment by chemical mechanical polishing (CMP) can be applied before the selective growth mask 250 is provided.

Figure 7F:
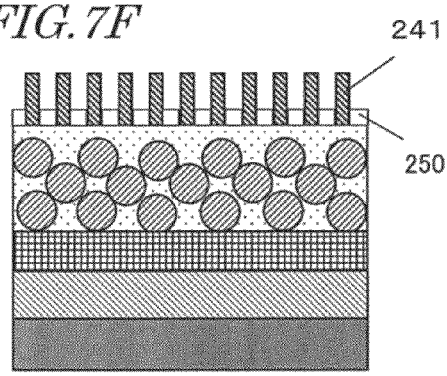

Then, as illustrated in FIG. 7F, the rods 241 formed of zinc oxide in the c-axis orientation is selectively grown from the matrix 232 in the phosphor layer 230 in the openings in the selective growth mask 250. In selectively growing the rods 241, solution growth is used. Chemical bath deposition or electrolytic deposition under atmospheric pressure, hydrothermal synthesis at pressures above atmospheric pressure, or the like is used. As the solution for the crystal growth, for example, a zinc nitrate solution containing hexamethylenetetramine is used. Exemplary pH or the zinc nitrate solution is 5 or more and 7 or less. In selectively growing the rods 241, in order for the pattern of the selective growth mask 250 not to be deformed, the temperature of the solution for the crystal growth is set to be equal to or lower than she softening point of the resin used, for example, equal to or lower than 120° C.

Figure 7G:
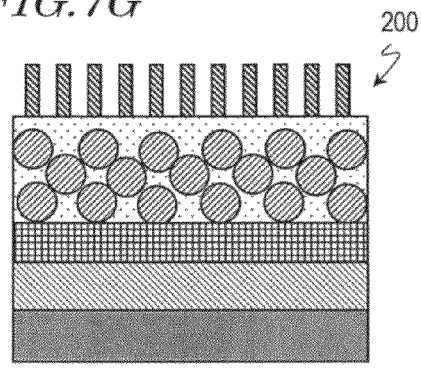

Then, as illustrated in FIG. 7G, the selective growth mask 250 is removed to obtain the wavelength conversion element 200. In removing the selective growth mask 250, an organic solvent such, as acetone or methanol can be used.

Note that, as a modification of this embodiment, the two-dimensional periodic structure 240 of the wavelength conversion element 200 may have other structures. For example, as illustrated in FIG. 5A, the two-dimensional periodic structure 240 may include the plurality of rods 241 which are arranged in a tetragonal lattice on the principal plane 230a of the phosphor layer 230. Further, as illustrated in FIG. 5B, the two-dimensional periodic structure 240 may have a plurality of openings 242. The two-dimensional periodic structure 240 is provided on the principal plane 230a of the phosphor layer 230, and the openings 242 expose the principal plane 230a. The plurality of openings 242 are arranged in a tetragonal lattice or in a triangular lattice.

Figure 8A:
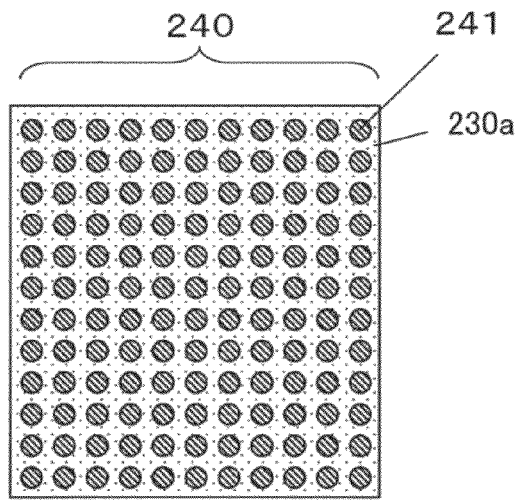
FIGS. 8A and 8B are plan views illustrating other modes of the two-dimensional periodic structure of the wavelength conversion element in Embodiment 3.
Figure 8B:
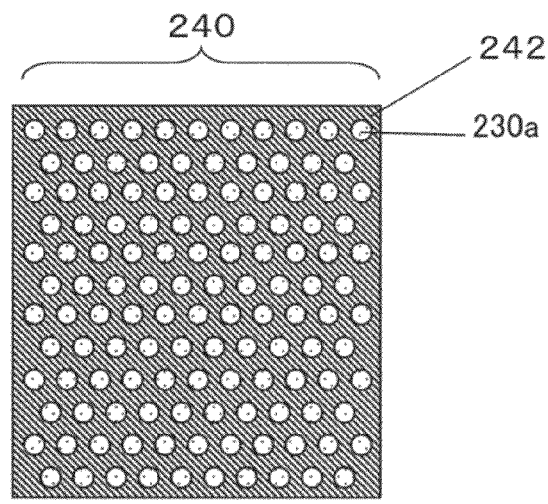

The two-dimensional periodic structures 240 illustrated in FIGS. 8A and 8B can be formed by using, in a process illustrated in FIG. 7E, the selective growth mask 250 in a pattern having a plurality of openings arranged in a tetragonal lattice or the selective growth, mask 250 in an island-like pattern, arranged in a triangular lattice.

Embodiment 4

An embodiment, of an LED element according to the present invention is described.

Figure 9A:
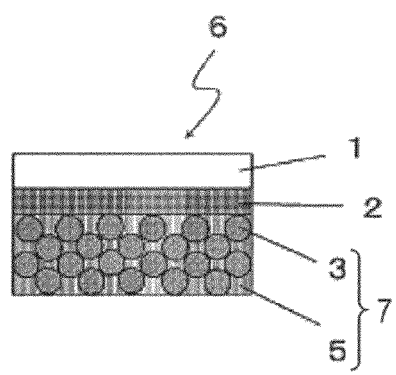

The LED element according to this embodiment can use any one of the wavelength conversion elements according to Embodiments 1 to 3. FIG. 9A illustrates the wavelength conversion, element 6 described in Embodiment 1 in a state of being upside down.

Figure 9B:
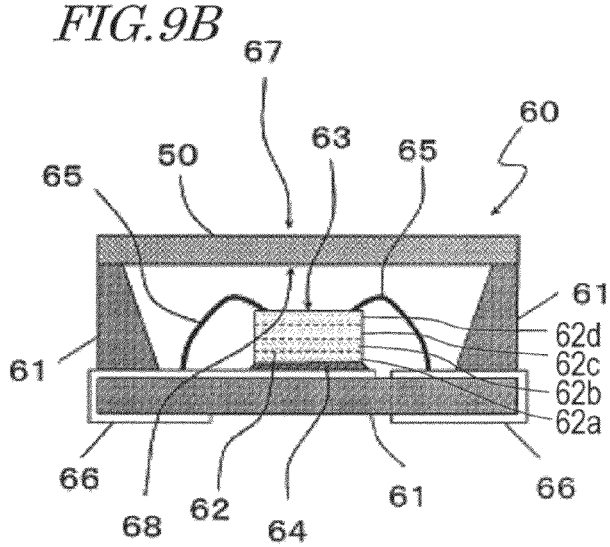

FIG. 9B is a sectional view of the LED element according to Embodiment 4. Electrodes of the LED chip, the internal structure of the LED chip, and the like are simplified for the sake of easy understanding. As illustrated in FIG. 9B, an LED element 60 includes a support 61, an LED chip 62, and a wavelength conversion element 50.

The support 61 supports the LED chip 62. In this embodiment, the LED element 60 has a structure which enables surface mounting. This embodiment is suitably used for a high-brightness LED element, and thus, for the purpose of enabling efficient, diffusion to the outside of neat generated by the LED element, the support 61 may have a nigh thermal conductivity. For example, ceramic formed of alumina, aluminum nitride, or the like may be used as the support 61.

The LED chip 62 emits excitation light for exciting the phosphor of the wavelength conversion element 50. The LED chip 62 includes, for example, a substrate 62a, an n-type GaN layer 62b, a p-type GaN layer 62d, and a light emitting layer 62c formed of InGaN and sandwiched between the n-type GaN layer 62b and the p-type GaN layer 62d. The LED chip 62 emits, for example, blue light. The LED chip 62 is fixed onto the support 61 by solder 64 or the like under a state in which a surface 63 from which light from the LED chip is emitted is on the upside. Further, the LED chip 62 is electrically connected via bonding wires 65 to electrodes 66 which are provided on the support. The LED chip 62 is surrounded by the support 61, and the wavelength conversion element 50 is fixed to the support 61. When the wavelength conversion element 50 is, as illustrated in FIG. 9A, placed so that the substrate 1 side thereof is on a side of a surface 67 from which light from the FED element is emitted, the phosphor layer 7 is not exposed to she outside. However, the substrate 1 of the wavelength conversion element 50 may be placed on a side of a surface 68 into which light from she LED chip 62 enters.

In the LED element 60, excitation light emitted from the LED chip 62 enters the wavelength conversion element 50. In the wavelength conversion element 50, a part of excitation light which enters the wavelength conversion element 50 enters the phosphor particles 3 to excite the phosphor. Thus, light in a wavelength band that is different from that of the excitation light is emitted. For example, when the phosphor is a yellow phosphor, blue light as the excitation light enters and yellow light is emitted.

Excitation light which does cot enter the phosphor particles 3 passes through the wavelength conversion element 50 as it is. In this way, light which is emitted from the wavelength conversion element 50 includes blue light surd yellow light, and thus, the LED element 60 emits white light.

Embodiment 5

An LED element according to another embodiment of the present invention is described. In Embodiment 5, LED elements using a wavelength conversion element which is formed by a method similar to that described in Embodiment 1 are described. The matrix used in the phosphor layer of the wavelength conversion element is formed of zinc oxide columnar crystals in the c-axis orientation.

FIG. 10 and FIG. 11 are sectional views of the LED elements in Embodiment 5. The electrodes of the LED chips, she support, the electrodes, the wiring of the LED elements, and the like are simplified for the sake of easy understanding.

Figure 10A:
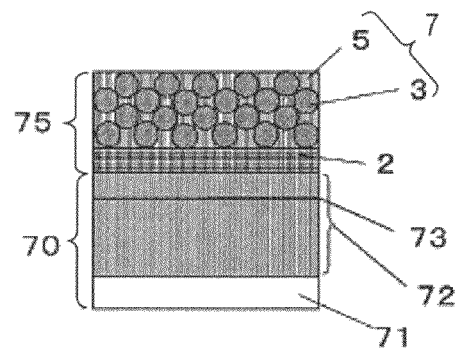
FIGS. 10A and 10B are sectional views of LED elements, respectively, in Embodiment 5.

The LED element illustrated in FIG. 10A includes an LED chip 70 and a wavelength conversion element 75. The LED chip 70 includes a substrate 71 and a semiconductor light emitting element 72 located on the substrate 71. The semiconductor light emitting element 72 further includes a light emitting layer 73. The wavelength conversion element 75 as directly formed on the semiconductor light emitting element 72, and has a structure of the wavelength conversion element 6 according to Embodiment 1 with the substrate 1 thereof being removed. In other words, the wavelength conversion element 75 includes the thin film 2 formed on the semiconductor light emitting element 72, and the phosphor layer 7.

Figure 10B:
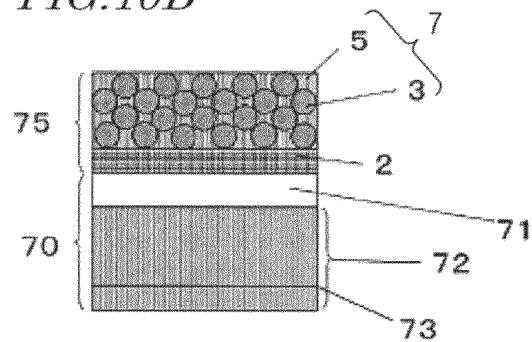

The LED element illustrated in FIG. 10B also includes she LED chip 70 and the wavelength conversion element 75, and the LED chip 70 is in a state of being upside down with respect to the LED element illustrated in FIG. 10A. In other words, the light emitting (Layer 73 of the LED chip 70 is located on a side opposite to the wavelength conversion element 75. The wavelength conversion element 75 includes the thin film 2 formed on the substrate 71, and the phosphor layer 7.

As the substrate 71, for example, a sapphire substrate or a GaN substrate may be used. Those substrates are highly transparent, and a semiconductor light emitting element having satisfactory characteristics and including n-type GaN a light emitting layer formed of InGaN, and p-type GaN can be formed on those substrates.

Both in the structure illustrated in FIG. 10A and in the structure illustrated in FIG. 10B, by using the LED chip 70 as the substrate, the wavelength conversion element 75 can be formed by a method similar to that described in Embodiment 1 on the semiconductor light emitting element 72 side or on the side of the substrate 71 of the semiconductor light emitting element.

Figure 11A:
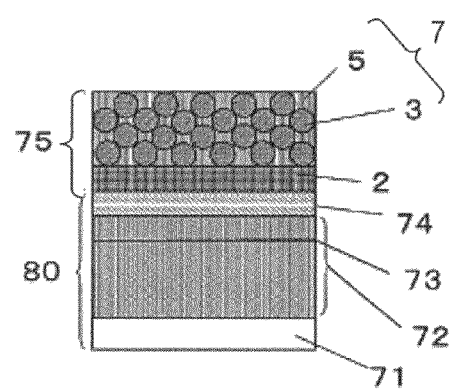
FIGS. 11A and 11B are sectional views of other LED elements, respectively, in Embodiment 5.
Figure 11B:
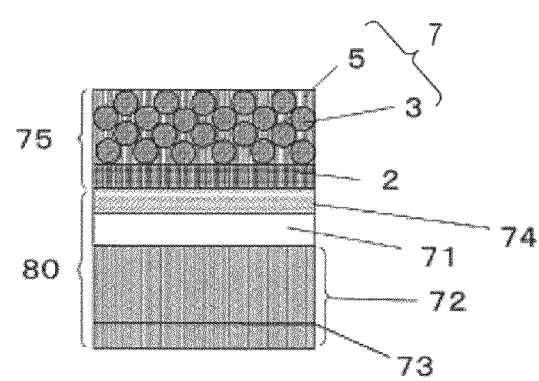

The LED elements according to this embodiment may also be formed using an LED chip 80 including a crystal separation layer 74 and using the wavelength conversion element 75. Specifically, as illustrated in FIG. 11A and FIG. 11B, the wavelength conversion element 75 can be formed by a method similar to that described in Embodiment 1 on the semiconductor light emit sing element 72 or on the substrate 71 of the semiconductor light emitting element, by using the LED chip 80 having the crystal separation layer 74 formed thereon as the substrate. The crystal, separation layer 74 is an underlayer for forming the thin film 2 formed of zinc oxide in the c-axis orientation, and can be formed of, for example, a material whose main component is amorphous silicon dioxide ($SiO_2$) not having a crystal structure, using plasma-enhanced chemical vapor deposition. Glass formed of a liquid glass raw material such as polysilazane may also be used. By forming the crystal separation layer 74, even when, for example, the substrate 71 of the semiconductor light emitting element is an m-plane of a GaN substrate and the semiconductor light emitting element 72 has a crystal structure which is epitaxially grown on the substrate 71, the crystal separation layer 74 is amorphous and does not have a crystal structure similarly to a glass substrate, and thus, irrespective of the crystal structure of the substrate 71, the thin film 2 of zinc oxide in the c-axis orientation can be formed. The thin film 2 of zinc oxide is in the c-axis orientation, and thus, the matrix 5 of the wavelength conversion element 75 can be formed of zinc oxide in the e-axis orientation by a method similar to that described in Embodiment 1.

Embodiment 6

An LED element according to still another embodiment of the present invention is described. In Embodiment 6, LED elements using a wavelength conversion element which is formed by a method similar to that described in Embodiment 2 are described. Embodiment 6 is an example in which the matrix used in the phosphor layer of the wavelength conversion element is formed of single crystalline zinc oxide in the c-axis orientation.

FIG. 12 are sectional views of toe LED elements in Embodiment 6. The electrodes of the LED chips, the support, she electrodes, the wiring of the LED elements, and the like are simplified for the sake of easy understanding.

The LED elements according to Embodiment 6 include the LED chip 70 and a wavelength conversion element 95.

The wavelength conversion element 95 includes the thin film 42 of single crystalline zinc oxide, and the phosphor layer which itself includes the phosphor particles 3 and the matrix 45. Similarly to the case of Embodiment 2, the phosphor layer is formed of single crystalline zinc oxide. The LED chip includes, similarly to the case of Embodiment 5, the semiconductor light emitting element 72 and the substrate 71.

Figure 12A:
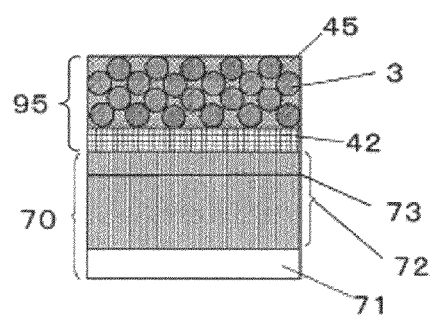
FIGS. 12A and 12B are sectional views of LED elements, respectively, in Embodiment 6.
Figure 12B:
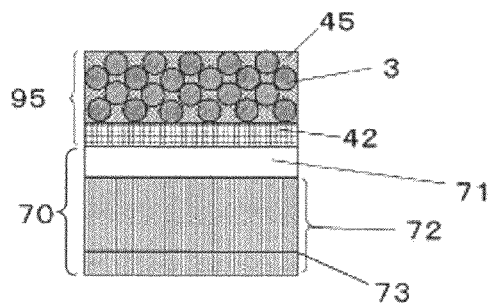

Insofar as the surface of the semiconductor light emitting element 72 or the substrate 71 of the semiconductor light emitting element has a crystal structure which enables formation of the thin film 42 of a single crystalline zinc oxide in the c-axis orientation, as illustrated in FIG. 12A and FIG. 12B, the thin film 42 of a single crystalline zinc oxide in the c-axis orientation can be formed on the semiconductor light emitting element 72 side or on the side of the substrate 71 of the semiconductor light emitting element by using the LED chip 70 as the substrate. The thin film 42 of zinc oxide is single crystalline in the c-axis orientation, and thus, the matrix 45 of the wavelength conversion element 95 can be formed of a single crystalline zinc oxide in the c-axis orientation by a method similar to that described in Embodiment 2.

As the substrate 71 of the semiconductor light emitting element, for example, a c-plane of a sapphire substrate or a c-plane of a GaN substrate can be used. In particular, both zinc oxide and gallium nitride have a crystal structure of the wurtzite type. The lattice mismatch ratios therebetween, along the a-axis and along the c-axis are 1.8% and 0.4%, respectively. Both the lattice mismatch ratios are significantly low. Therefore, the thin film 2 formed of single crystalline zinc oxide in the c-axis orientation can be epitaxially grown on the semiconductor light emitting element side or on the substrate side.

Embodiment 7

An embodiment of a semiconductor laser light emitting device according to the present invention is described.

Figure 13:
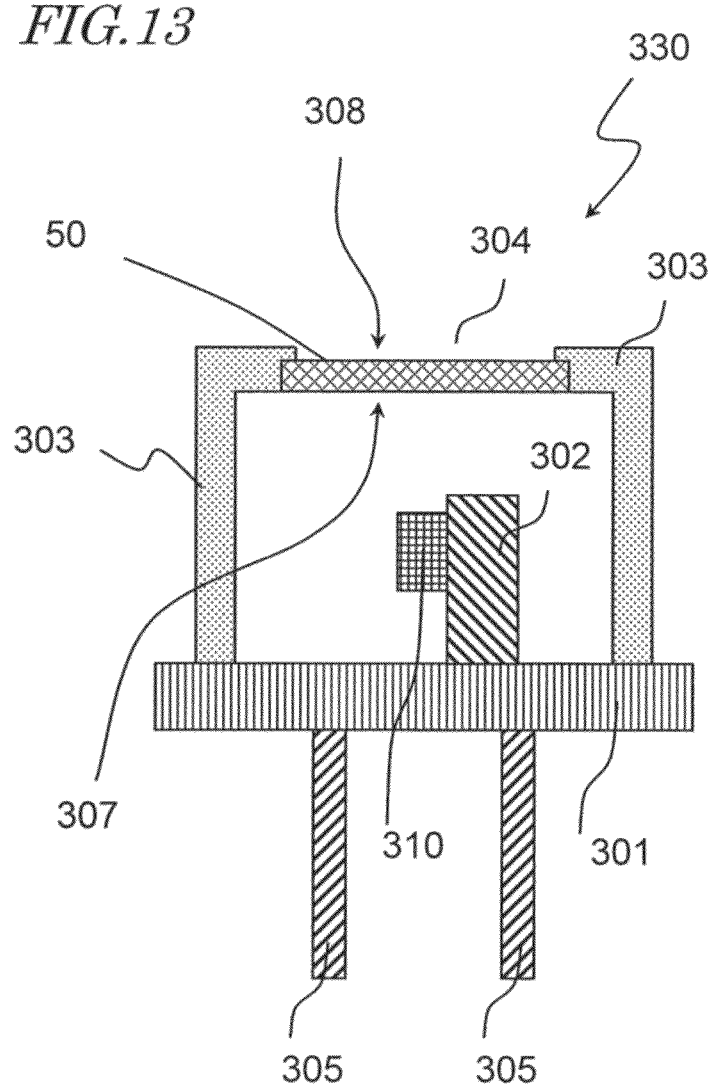
FIG. 13 is a sectional view of a semiconductor laser light emitting device in Embodiment 7.

FIG. 13 is a sectional view of a semiconductor laser light emitting device 330 according to Embodiment 7. The infernal structure, electrodes, connection wiring, and the like of the semiconductor laser chip are simplified for the sake of easy understanding. The semiconductor laser light emitting device 330 includes a semiconductor laser chip 310, the wavelength conversion element 50, and a stem 301 for supporting the semiconductor laser chip 310 and the wavelength conversion element 50. The semiconductor laser chip 310 is supported via a block 302 by the stem 301, and she wavelength conversion element 50 is supported via a cap 303 by the stem 301. The stem 301 and the block 302 are formed of, for example, a metallic material mainly containing Fe or Cu, are formed in one piece using a mold, and, in operation, efficiently discharge heat generated in the semiconductor laser chip 310. The cap 303 is formed of a metallic material mainly containing Fe and Ni, and is fused to the stem 301 by welding or the like. The semiconductor laser chip 310 is mounted on the block 302, and bonding wires electrically connect the semiconductor laser chip 310 and leads 305. An opening 304 is provided in the cap 303, and the wavelength conversion element is provided so as to cover the opening 304. Excitation light from the semiconductor laser chip 310 enters a light entering surface 307 of the wavelength conversion element 50. The semiconductor laser light emitting device 330 emits light which is a composite of excitation light sham passes through the wavelength conversion element 50 and fluorescence that is converted from the excitation light.

In FIG. 13, the semiconductor laser chip 310 is directly mounted on the block 302, but the semiconductor laser chip 310 way be mounted on the block 302 via a submount formed of AlN, Si, or the like. The semiconductor laser light emitting device 330 has an advantage in that, if the substrate of the wavelength conversion element 50 is placed on a light emitting surface 308 side, the phosphor layer is not exposed to the outside. However, the substrate may also be placed on the light entering surface 307 side.

Embodiment 8

A projector apparatus according to an embodiment of the present invention is described. In Embodiment 8, a projector apparatus which uses, as a color wheel, any one of the wavelength conversion elements according to Embodiments 1 to 3 is described.

Figure 14A:
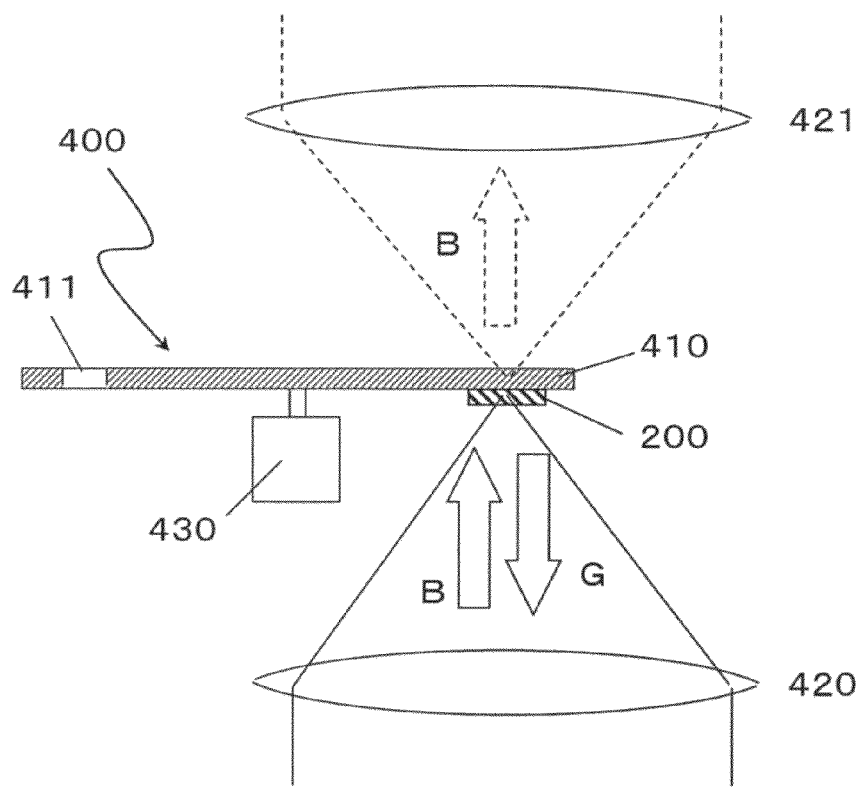
FIG. 14A is a sectional view or a color wheel in Embodiment 8.
Figure 14B:
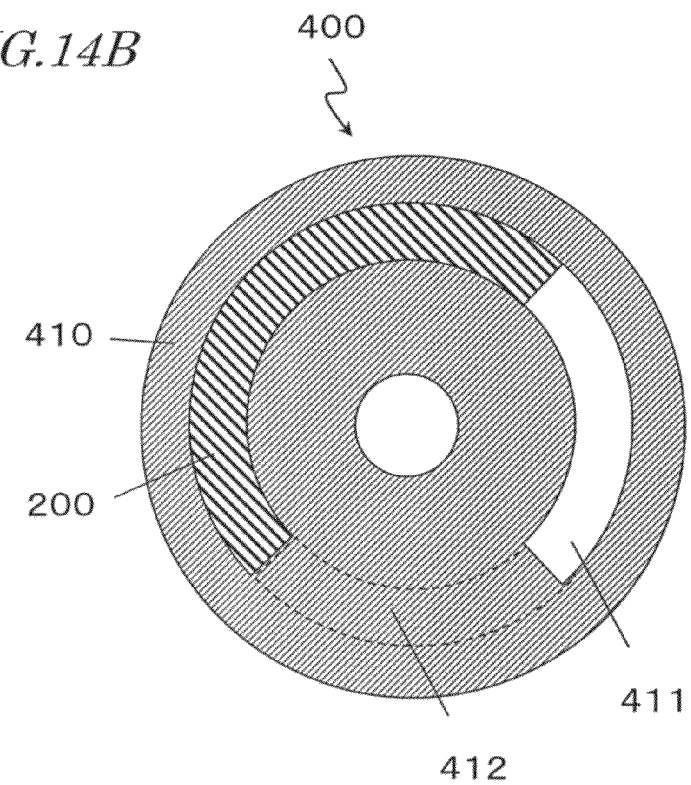
FIG. 14B is a plan view of the color wheel in Embodiment 8.

FIGS. 14A and 14B illustrate a color wheel 400 used in the projector apparatus of this embodiment. FIG. 14A illustrates the positioned relationship between the color wheel 400 and light emitted from a light source, and FIG. 14B illustrates a structure of the color wheel 400.

As illustrated in FIGS. 14A and 14B, the color wheel 400 includes a disc 410 and the wavelength conversion element 200. The disc 410 holds the wavelength conversion element 200. The disc 410 has an opening 411 provided therein. Blue light B which is collimated excitation light is condensed by a lens 420 so be radiated to the wavelength conversion element 200, and green light G which is fluorescence emitted from the wavelength conversion element 200 is condensed by the lens 420 to be collimated. By rotating the disc 410 by a wheel motor 430 and moving the location of the condensed high-brightness blue light B, a region of the wavelength conversion element 200 having a temperature which increases by the condensed blue light B is cooled to inhibit temperature rise of the wavelength conversion element 200. When the blue light B is radiated to the opening 411, the blue light B passes through the disc 410, and is condensed by a lens 421 to be collimated.

As illustrated in FIG. 14B, the location of the condensed blue light B on the disc 410 changes as the disc 410 rotates, and thus, the wavelength conversion element 200 and the opening 411 are arranged so as to form, arcs, respectively. A light shielding region 412 on the disc 410 having neither the wavelength conversion element 200 nor the opening 411 provided therein corresponds to a time period during which a red display is produced in spatial light modulation in the projector. Note that, the area ratio and the arrangement of the wavelength conversion element 200, the opening 411, and the light shielding region 412 can be appropriately designed in accordance with the spatial light modulation in the projector.

Figure 15:
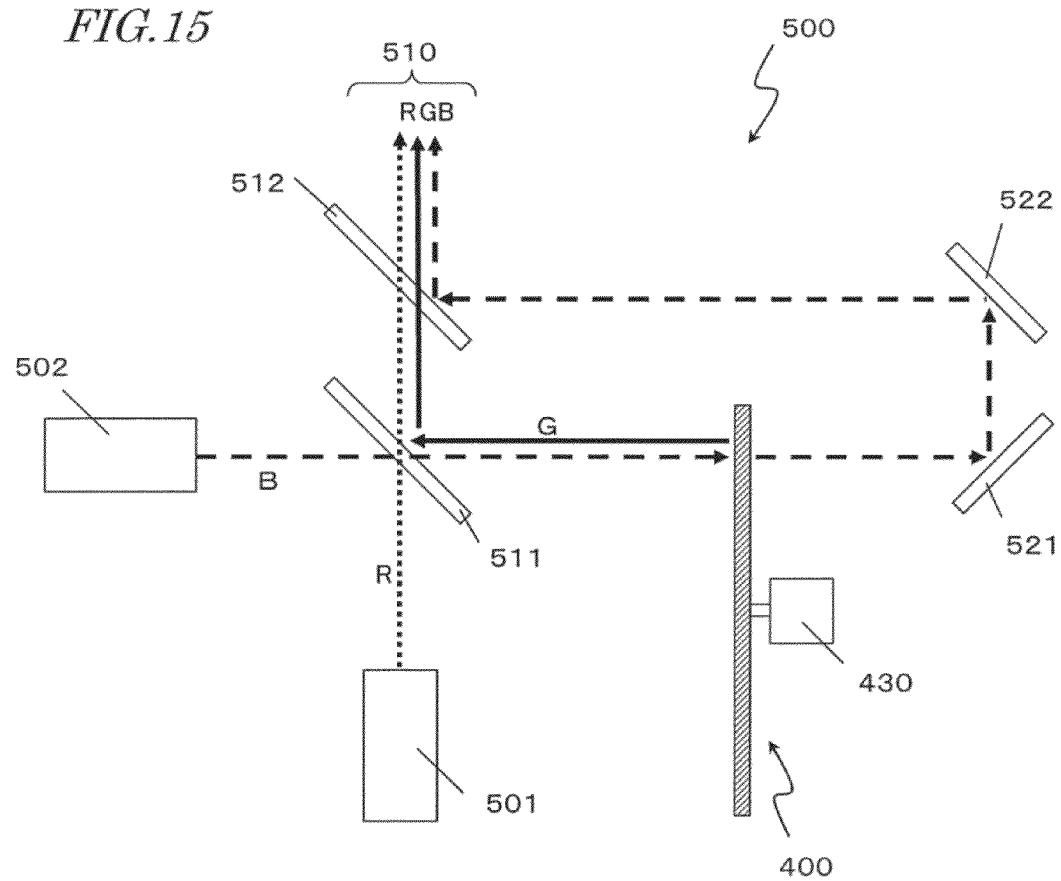
FIG. 15 is a view illustrating a structure of a light source portion of a projector apparatus in Embodiment 8.

FIG. 15 illustrates a light source 500 for a projector using the color wheel 400 in Embodiment 8. From red light R from a red light source 501, blue light B from a blue light source 502, and green light G from the wavelength conversion element 200 on the color wheel 400, the light source 500 generates output light 510 in a time-shared manner in accordance with the timing of light emission by the light sources and the rotation of the color wheel 400. In the projector, the output light 510 is radiated to a spatial light modulator, and a color image is generated in synchronization with the time-shared timing of RGB of the output light 510.

The red light source 501 is formed of a red LED or a red laser diode (LD). In time sharing, the red light source 501 performs light emitting operation only during a time period in which the red light R is necessary to emit the red light R. The red light R emitted from the red light source 501 passes through dichroic mirrors 511 surd 512 which transmit light in red wavelengths to be output.

The blue light source 502 is formed of a blue LED or a blue laser diode (LD). In time sharing, the blue light source 502 performs fight emitting operation only during a time period in which the blue light B and the green light G are necessary. The blue light B emitted from the blue light source 502 passes through the dichroic mirror 511 which transmits light in blue wavelengths to reach the color wheel 400. In time sharing, during a time period in which the blue light B is necessary, the blue light B passes through, the opening 411 in the color wheel 400 in accordance with the rotation of the color wheel 400. The blue light B which, passes through the color wheel 400 is reflected by mirrors 521 and 522. The blue light B is further reflected by the dichroic mirror 512 which reflects light in blue wavelengths, thereby aligning the optical axis of the blue light B and the optical axis of the red light R to be output as the output light 510.

The green light G is generated from the color wheel 400 by excitation by the blue light B of the wavelength conversion element 200 only during a time period in which the green light G is necessary in the time sharing. The green light G emitted from the color wheel 400 reaches the dichroic mirror 511. The optical axis of the green light G is aligned with the optical axis of the red light R by the dichroic mirror 511 which reflects light in green wavelengths. The green light G passes through the dichroic mirror 512 which transmits light in green wavelengths to be output as the output light 510.

Embodiment 9

A headlight and a vehicle according to an embodiment of the present invention are described. In Embodiment 9, a headlight and a vehicle which use any one of the wavelength conversion elements according to Embodiments 1 to 3 are described.

Figure 16A:
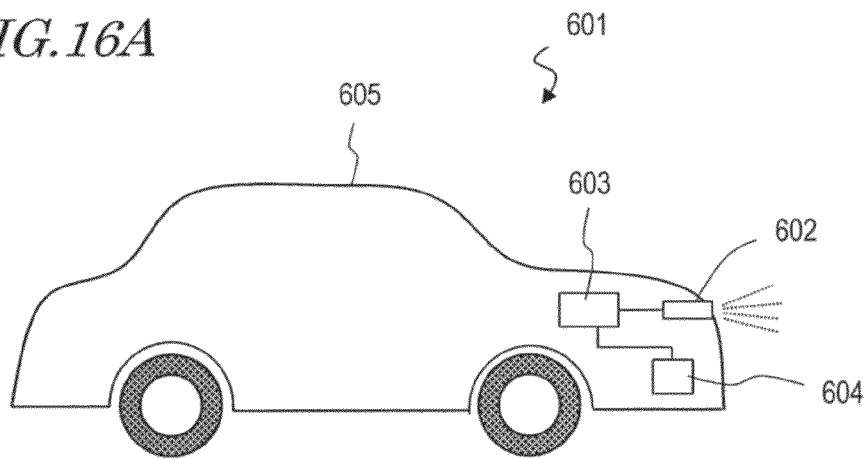
FIGS. 16A and 16B are views illustrating structures of a vehicle and a headlight, respectively, in Embodiment 9.

FIG. 16A schematically illustrates a structure of the vehicle according to this embodiment. A vehicle 601 includes a vehicle body 605, a headlight 602 provided at a front portion of the vehicle body 605, a power supply 603, and an electric generator 604. The electric generator 604 is rotationally driven by a drive source such as an engine (not shown) to generate electric power. The generated electric power is stored in the power supply 603. In this embodiment, the power supply 603 is a secondary battery which can be charged and discharged. When the vehicle 601 is an electric car or a hybrid car, a motor for driving the vehicle may be the electric generator 604. The headlight 602 is lit by electric power from the power supply.

Figure 16B:
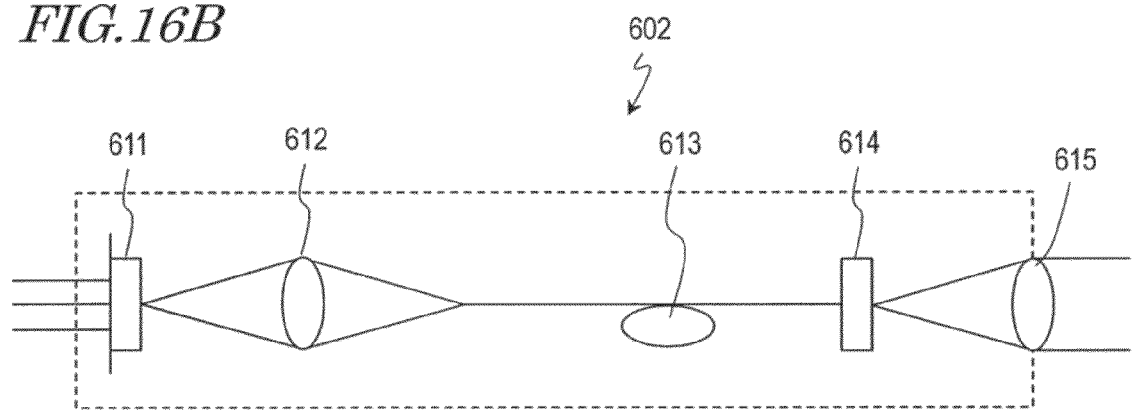

FIG. 16B illustrates a schematic structure of the headlight 602. The headlight 602 includes a semiconductor laser chip 611, an optical system 612, an optical fiber 613, a wavelength conversion element 614, and an optical system 615. The semiconductor laser chip 611 has a structure in which, for example, the semiconductor laser light emitting device 330 according to Embodiment 7 is provided with a transparent plate instead of the wavelength conversion element 50.

Light emitted from the semiconductor laser chip 611 is condensed by the optical system 612 to an end of the optical fiber 613 to pass through the optical fiber 613. Light which is emitted from the other end of the optical, fiber 613 enters the wavelength conversion element 614 and at least a part of the wavelengths is converted to be emitted. Further, the optical system 615 controls the range of lighting. In this way, the headlight 602 lights the way ahead the vehicle 601.

According to the headlight of this embodiment, the matrix in the phosphor layer of the wavelength conversion element is formed of an inorganic material having a high thermal conductivity and high resistance to heat, and thus, even when the wavelength conversion element is used for a headlight which emits highly intense light, the wavelength conversion element has excellent heat discharging property and excellent resistance to heat, and deterioration of the phosphor layer due to heat is inhibited for a long time. Further, the emission efficiency is high, and thus, electric power consumption of the power supply is low. Still further, light emitted from the semiconductor laser chip is introduced by the optical fiber to the wavelength conversion element, and thus, the arrangement of the semiconductor laser chip and the wavelength conversion element in the headlight is not limited.

As described above, according to embodiment 1, by using the thin film formed of zinc oxide in the c-axis orientation, spaces among phosphor particles can be densely filled with zinc oxide columnar crystals in the c-axis orientation. In this manner, a grain boundary in zinc oxide in the direction of light emission in the phosphor layer can be inhibited, and at the same time, a void in the phosphor layer can be inhibited.

According to Embodiment 2, by using the thin film formed of single crystalline zinc oxide, spaces among phosphor particles can be densely filled with epitaxially grown single crystalline zinc oxide. In this manner, light scattering due to grain boundaries in zinc oxide in the phosphor layer can be prevented, and at the same time, a void in she phosphor layer can be inhibited.

The matrix in the phosphor layer is formed by directly crystal growing zinc oxide from the thin film formed of zinc oxide which is the same material. Therefore, the cohesion between the phosphor layer and the substrate is high.

In the phosphor layer, zinc oxide is crystal grown from the thin film formed of zinc oxide through the gaps in the phosphor particle layer. As a result, at the surface of the phosphor layer, rod-like zinc oxide can be formed in a self-organizing manner from she narrow gaps among the phosphor particles on the surface. The uneven structure formed of the zinc oxide rods can be formed on the surface of the phosphor layer, and thus, reflection of light doe to the refractive index difference between the phosphor layer and air can be reduced.

According to Embodiment 3, the two-dimensional periodic structure is further provided on the surface of the phosphor layer, and thus, the directivity of light emitted from the phosphor layer can be further enhanced.

According to Embodiment 4, the above-mentioned wavelength conversion element is included, and thus, an LED element which is resistant to heat and has high optical output can be realized.

According to Embodiment 5, the LED element in which the above-mentioned wavelength conversion element is formed on the semiconductor light emitting element or on the substrate of the semiconductor light emitting element via the crystal separation layer can be formed. According to this structure, even when the crystal structure of the semiconductor light emitting element or of the substrate of the semiconductor light emitting element prevents the c-axis orientation of zinc oxide, the thin film formed of zinc oxide in the c-axis orientation can be formed. In this manner, the matrix in the phosphor layer can be formed of zinc oxide in the c-axis orientation.

According to Embodiment 6, the crystal structure of the semiconductor light emitting element or of the substrate of the semiconductor light emitting element can be used to form the matrix in the phosphor layer of single crystalline zinc oxide. It is not necessary to additionally prepare an expensive single crystalline substrate, and thus, the cost of the LED element can be reduced.

According to Embodiment 7, the light emitting device in which the phosphor layer of the above-mentioned wavelength conversion element is excited by laser light emitted from the semiconductor laser chip can be formed. According to this structure, the of directivity and the brightness of the semiconductor laser chip are higher than those of the LED chip. Further, in the phosphor layer, light scattering in the phosphor is inhibited, and thus, the semiconductor laser light emitting device according to this embodiment can realise a light source having high directivity or high brightness.

According to Embodiment 8, the phosphor layer of the above-mentioned wavelength conversion element can be used for the color wheel which is excited by light emitted from an LED chip or by laser light emitted from a semiconductor laser chip. The color wheel according to this embodiment can inhibit light scattering in the phosphor layer, and thus, a fight source for a projector having high efficiency can be formed.

According to Embodiment 9, a highly reliable headlight is realized which has excellent resistance to heat and inhibits for a long time deterioration of the phosphor layer due to neat.

The wavelength conversion element, the LED element, and the semiconductor laser light emitting device according to the embodiments are described in detail using the following examples.

Example 1

(Formation of Thin Film of Zinc Oxide on Glass Substrate)

As the substrate, a soda glass substrate having a thickness of 1 mm was prepared. Electron beam deposition was used to form, on the glass substrate, a thin film of zinc oxide (ZnO) underlayer) in the c-axis orientation, which had a thickness of 150 nm and which was doped with 3 at % of Ga. The substrate temperature when the film was formed was 180° C. After the film was formed, annealing was carried cot in the atmosphere by raising the temperature from room temperature to 500° C. in 30 minutes, and keeping the temperature at 500° C. for 20 minutes.

(Formation of Phosphor Particle Layer)

A $Y_3Al_5O_{12}$:Ce (TAG:Ce) phosphor having a refractive index of 1.8 and an average particle diameter of 3 μm was used to prepare the phosphor dispersed solution. TAG:Ce phosphor particles (0.1 g), send phosphate ester (0.0003 g) and polyethyleneimine (0.0003 g) as dispersants were mixed with ethanol (30 ml) as a dispersion solvent, and an ultrasonic homogenizer was used to disperse the phosphor particles in the solvent.

The obtained phosphor dispersed solution was used to form, by electrophoresis, the phosphor particle layer on the substrate having the ZnO underlayer formed thereon. The conditions of depositing the phosphor particle layer were as follows. The ZnO underlayer was used as a cathode, a Pt electrode was used as an anode, the applied voltage was 100 V, and the time period of the voltage application was three minutes. After the phosphor particle layer was deposited, ethanol as the solvent was dried to complete the phosphor particle layer (having a thickness of about 17 μm). The weight per unit area of the phosphor was 3.3 mg/cm$^2$.

(Filling of Spaces among Phosphor Particles with Zinc Oxide)

As the method of solution growth of zinc oxide to be the matrix, chemical bath deposition was used. As a zinc oxide growing solution, an aqueous solution in which zinc nitrate (0.1 mol/L) and hexamethylenetetramine (0.1 mol/L) were dissolved was prepared. The solution had a pH value of 5 to 7. The substrate having the phosphor particle layer formed thereon was immersed, in the zinc oxide growing solution and the temperature of the zinc oxide growing solution was held at 90° C. to crystal grow zinc oxide in the voids in the phosphor particle layer. After this, the substrate was taken out, was cleaned with pure water, and was dried.

(Mounting of Wavelength Conversion Element on LED Element and Evaluation of LED Element)

A plurality of blue LED chips having a light emission wavelength of 465 nm and having the same light emission intensity were prepared. The phosphor layer in which the spaces among phosphor particles were filled with zinc oxide was cat by dicing so as to conform to the size of the support 61 to prepare an individualized wavelength conversion element. As illustrated in FIG. 9B, the blue LED chip was attached to the support 61 using the solder 64, and wiring was carried out between the electrodes 66 provided, on the support 61 and the blue LED chip. Then, as illustrated in FIG. 9B, ends of the wavelength conversion element which was cut so as to conform to the size of the support 61 were fixed to the support 61 with an adhesive of a silicone resin so that, the substrate side was the side of the surface 67 from which light from the LED element is emitted to complete the LED element illustrated in FIG. 5B. The completed LED element was attached to an integrating sphere and driven by a constant current of 20 mA, and the light emission intensity of the entire radiant flux of the LED element was measured. The result is shown in Table 1.

(Evaluation of Refractive Index of Zinc Oxide)

On a glass substrate having the ZnO underlayer formed thereon, which was the same as that used in Example 1, the phosphor particle layer was not formed, and only a zinc oxide film was formed by crystal growth, using solution growth which was similar to that used in Example 1. The refractive index of the zinc oxide film measured by spectroscopic ellipsometry won 2.0.

Comparative Example 1

As the substrate, a soda glass substrate having a thickness of 1 mm was prepared. The phosphor which was she same as that used in Example 1 was mixed with a silicone resin in which A component and B component of a dimethyl silicone resin were mixed with the weights thereof being the same, so that the phosphor was 8 vol % in the phosphor layer. Then, the mixture was passed through a three-roil kneader three times, and vacuum defoaming was carried out to obtain a silicone resin mixture. After that, the obtained silicone resin mixture was applied onto the glass substrate and the silicone resin mixture was cured at 150° C. for four hours to obtain a phosphor layer (having a thickness of 90 μm) with the silicone resin being used as the matrix. The weight per unit area of the phosphor calculated by the volume fraction of the phosphor in the phosphor layer and the thickness of the phosphor layer was 3.3 mg/cm$^2$. The phosphor layer was used to complete an LED element by a method similar to that used in Example 1, and the light emission intensity of the entire radiant flux of the LED element was measured. The result is shown in Table 1.

Comparative Example 2

A phosphor particle layer was formed in the same method as that used in Example 1 on the glass substrate having the ZnO underlayer formed thereon, which was the same as that used in Example 1. The weight per unit area of she phosphor was 3.3 mg/cm$^2$. The phosphor layer was used to complete an LED element by a method similar to shat used in Example 1, and the light emission intensity of the entire radiant flux of the LED element was measured. The result is shown in Table 1.

Comparative Example 3

A glass substrate with ITO was prepared, in which an ITO (indium oxide doped with tin) film was formed by electron beam deposition on a soda glass substrate having a thickness of 1 mm. Similarly to the case of Example 1, a phosphor particle layer was formed on the glass substrate with ITO. The weight per unit area of the phosphor was 3.3 mg/cm$^2$.

Then, voids in the phosphor particle layer were filled with zinc oxide by a sol-gel method. Zinc acetate dehydrate ($Zn(CH_3COO)_2 \cdot 2H_2O$) was prepared as a zone source, ethanol was prepared as a solvent, and diethanolamine ($HN(CH_2CH_2OH)_2$) was prepared as a stabiliser. A raw material solution for the sol-gel method was prepared, in which the mole ratios of diethanolamine and $Zn^{2+}$ were the same and 0.5 mol/L of zinc acetate was dissolved in ethanol. The obtained raw material solution for the sol-gel method was dropped onto the phosphor particle layer, and vacuum drawing was performed by a rotary pump to impregnate the voids in she phosphor particle layer with the raw material solution. Then, heating was carried out at 400° C. for an hour to convert the raw material solution into zinc oxide. The phosphor layer was used to complete an LED element by a method similar so that used in Example 1, and the light emission intensify of the entire radiant flux of the LED element was measured. The result is shown in Table 1.

Figure 17:
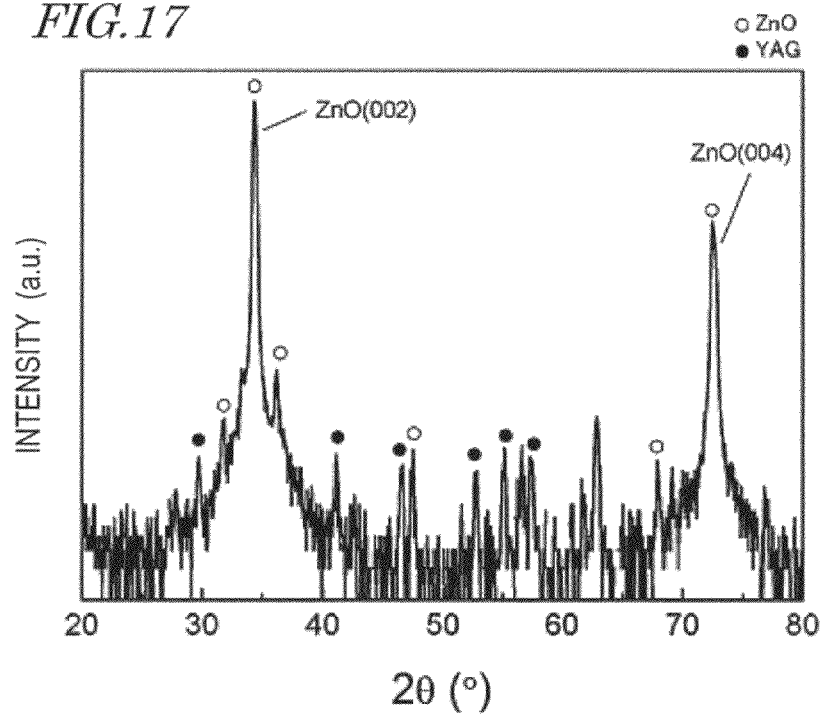
FIG. 17 is a graph showing the result of X-ray diffraction (XRD) measurement (2θ/ω scan) of a wavelength conversion element in Example 1.

FIG. 17 shows the result of XRD measurement (2θ/ω scan) of the wavelength conversion element of Example 1. The measurement can detect a crystal lattice plane in parallel with the substrate. As shown in FIG. 17, compared with diffraction peaks of the phosphor or zinc oxide other than in the c-plane, significantly high peaks of zinc oxide (002) and zinc oxide (004) were detected. This enabled confirmation that zinc oxide in the wavelength conversion element of Example 1 had a significantly high degree of c-axis orientation. In this way, with regard to the result of XRD measurement (2θ/ω scan) of the wavelength conversion element, she diffraction, peaks of zinc oxide in the c-plane are higher than diffraction peaks of zinc oxide other than in she c-plane, and thus, it can be confirmed than zinc oxide in this case is crystals in she c-axis orientation.

Figure 18:
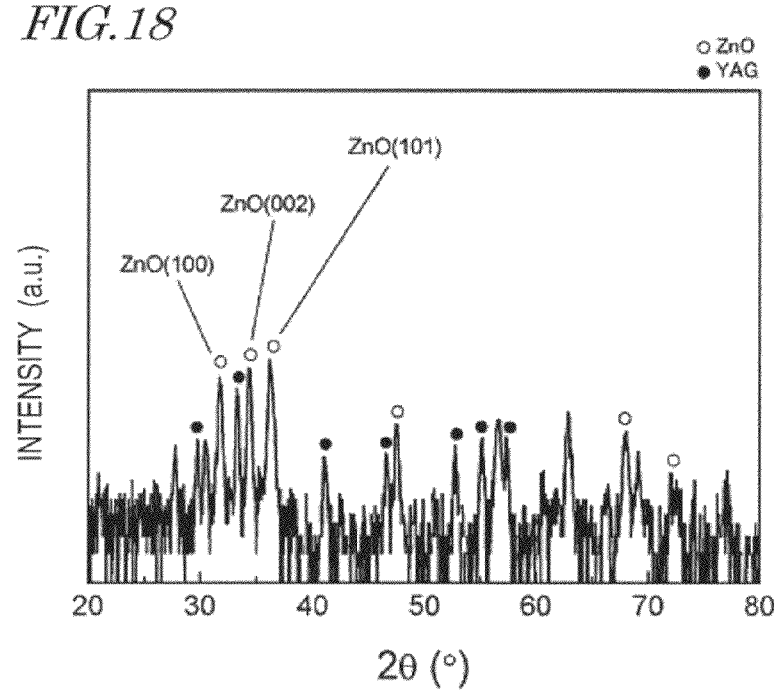
FIG. 18 is a graph showing the result of XRD measurement (2θ/ω scan) of a wavelength conversion element in Comparative Example 3.

FIG. 18 shows the result of XRD measurement (2θ/ω scan) of the wavelength conversion element of Comparative Example 3. As shown in FIG. 18, differently from the case of Example 1, the peak intensity of the phosphor and the peak intensity of zinc oxide were to similar extents. Further, peaks of zinc oxide (100), zinc oxide (002), and zinc oxide (101)

were detected and the peak intensities thereof were to similar extents. This enabled confirmation that zinc oxide of the wavelength conversion element of Comparative Example 3 was in random orientations. Table 1 covers the result of the light emission intensities of the LED elements.

TABLE 1

| Sample | | Light emission intensity |
|---|---|---|
| Example 1 | Phosphor + zinc ozide columnar crystals in c-axis orientation | 120 |
| Comparative Example 1 | Phosphor + silicone resin | 100 |
| Comparative Example 2 | Phosphor particle layer only | 60 |
| Comparative Example 3 | Phosphor + zinc ozide in random orientations | 73 |

The weight per unit area of the phosphor was set to be equal in all of the samples. The light emission intensities of the LED elements other than the LED element of Comparative Example 1 are expressed supposing that the light emission intensity of the LED element of Comparative Example 1 is 100. The light emission intensity of Example 1 was 120, and the obtained light, emission intensity was 1.2 times as high as that of the LED element of Comparative Example 1 using the phosphor layer in which the phosphor particles were dispersed in the silicone resin. The light emission intensity of the LED element of Comparative Example 2 using the phosphor layer in which the phosphor particles were just accumulated on the substrate was 60. In Example 1, the obtained light emission intensity was twice as high as that in the case of Comparative Example 2. The light emission intensity of the LED element of Comparative Example 3 using the phosphor layer in which the inside of the phosphor particle layer was filled with zinc oxide in ransom orientations was 73. In Comparative Example 3, the obtained light emission intensity was 1.2 times as high as that in the case of Comparative Example 2, but, in Comparative Example 3, the obtained light emission intensity was lower than those of Example 1 and Comparative Example 1. This is because, when the inside of the phosphor particle layer is filled with zinc oxide in random orientations, a large number of grain boundaries of zinc oxide exist, in the direction of light emission, and thus, light scattering in the phosphor layer occurs to a large extent.

Figure 19:
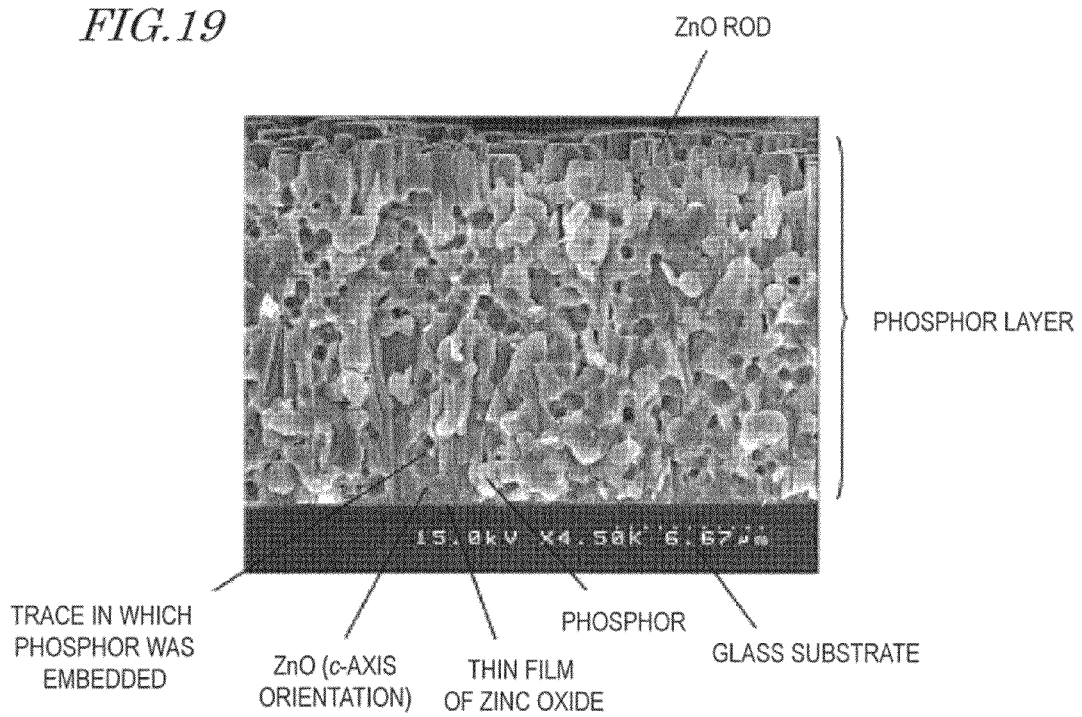
FIG. 19 is a photograph of an image observed under a scanning electron microscope (SEM) of a section of a phosphor layer in Example 1.
Figure 20A:
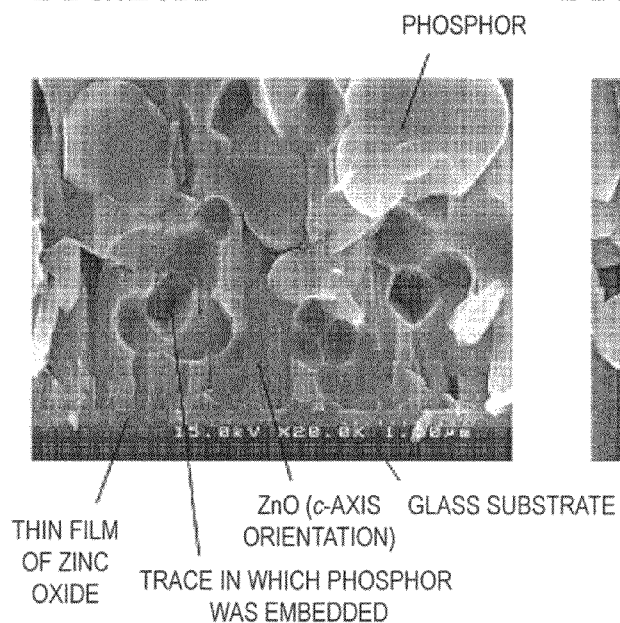
FIG. 20A is a photograph of an image observed under a SEM of a section of the phosphor layer around an interface with a substrate in Example 1.
Figure 20B:
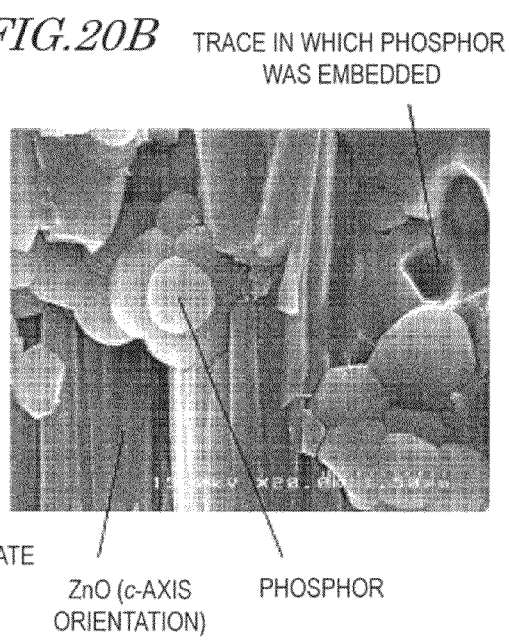
FIG. 20B is a photograph of an image observed under a SEM of a section of the phosphor layer around the center in Example 1.

FIG. 19 is an image observed under a SEM of a section of the phosphor layer of Example 1. FIG. 20 are enlarged images observed under a SEM of sections of the phosphor layer of Example 1. Samples are observed in a fracture cross-section, of the phosphor layer, and thus, places which lock like round recesses in the observed image are traces in which she phosphor particles were embedded, and the phosphor is thought to be on a plane on an opposite side of the ruptured samples. FIG. 20A shows a portion around an interface with the substrate, and FIG. 20B shows a center portion. As shown in FIG. 19, the zinc oxide rods grew on the surface of the phosphor layer, and unevenness by the zinc oxide rods was able to be formed in a self-organizing manner. As is clear from FIG. 19, FIG. 20A, and FIG. 20B, the inside of the phosphor layer is densely filled with zinc oxide over the entire phosphor layer. Further, vertical grain boundaries are observed in zinc oxide in the phosphor layer. This shows that zinc oxide grew into columnar crystals by solution growth. From FIG. 20A, it can be seen that zinc oxide as the matrix was held, in close contact with the thin film of zinc oxide, and zinc oxide was crystal grown from the thin film of zinc oxide. From FIG. 20B, a state in which zinc oxide columnar crystals fill space around the phosphor particles can be seen. Zinc oxide columnar crystals having only a small number of gram boundaries in the direction of light emission was able to be arranged, and thus, light scattering in the phosphor layer was able to be inhibited.

Figure 21:
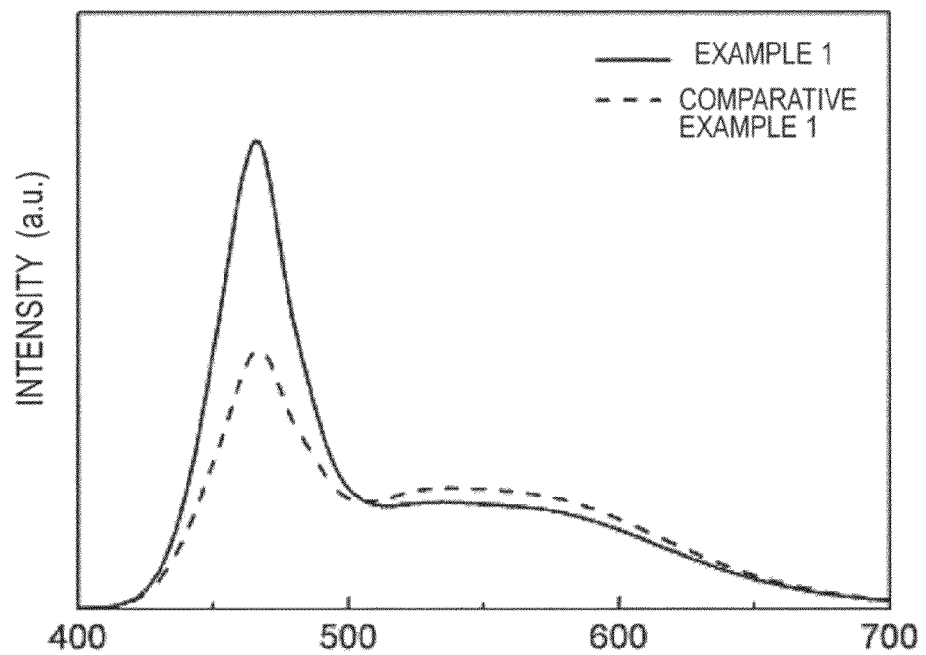
FIG. 21 is a graph showing the result of measurement of emission spectra of LED elements in Example 1 and Comparative Example 1, respectively.

FIG. 21 shows emission spectra of the LED elements of Example 1 and Comparative Example 1, respectively. In Example 1, the inside of the phosphor particle layer was able to be densely filled with zinc oxide columnar crystals, and thus, light scattering in the phosphor layer was able to be inhibited more than in the case of Comparative Example 1, and blue light from the LED chip was able to be taken outside of the LED element with efficiency.

Example 2

Wish regard to she film forming conditions in forming the ZnO underlayer on the glass substrate, the substrate was not heated in the film formation, and annealing was not carried out after the film formation. An LED element was completed by a method similar to that used in Example 1 except for those conditions, and the light emission intensity of the entire radioed flux of the LED element was measured. The result is shown in Table 2, Note that, the weight per unit area of the phosphor was 3.3 mg/cm$^2$.

Example 3

With regard to the film forming conditions in forming the ZnO underlayer on the glass substrate, the substrate temperature was set to 180° C. in the film formation, and annealing was not carried out after the film formation. An LED element was completed by a method similar to that uses; in Example 1 except for those conditions, and the light, emission intensity of the entire radiant flux of the LED element was measured. The result is shown in Table 2. Note that, the weight per unit area of the phosphor; was 3.3 mg/cm$^2$.

Example 4

With regard to the film forming conditions in forming the ZnO) underlayer on the glass substrate, the substrate temperature was set to 180° C. in the film formation. Further, after the film formation, annealing was earned out in the atmosphere by raising the temperature from room temperature to 300° C. in 30 minutes, and keeping the temperature at 300° C. for 20 minutes. An LED element was completed by a method similar to that used in Example 1 except for those conditions, and the light emission intensity of the entire radiant flux of the LED element was measured. The result is shown in Table 2. Note that, the weight per unit area of the phosphor was 3.3 mg/cm$^2$.

Figure 22:
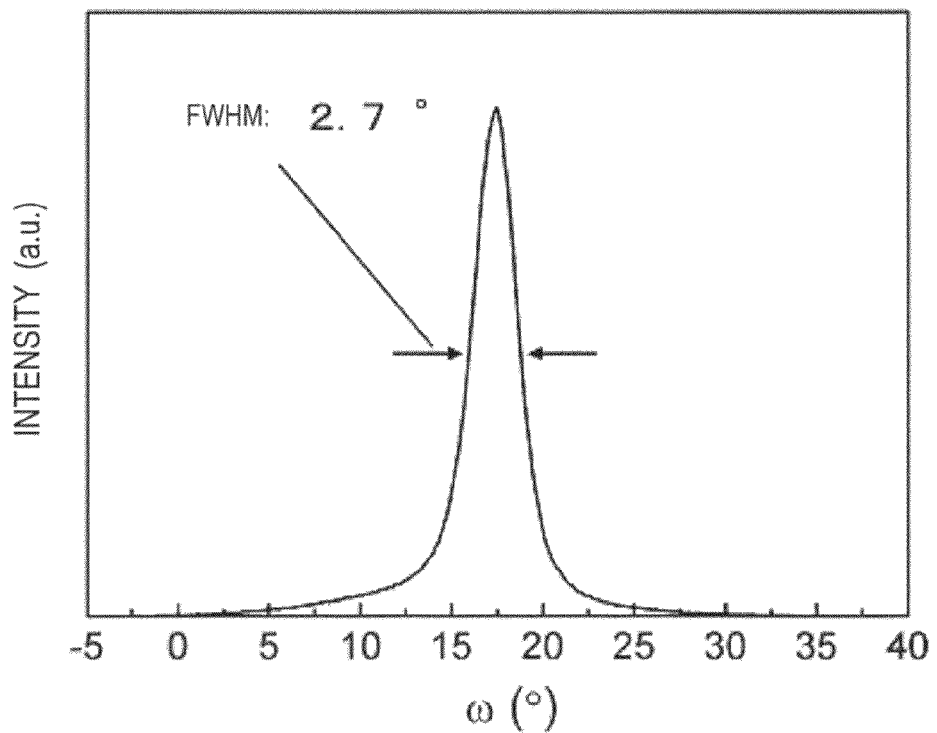
FIG. 22 is a graph showing the result of XRD measurement (ω scan) of the wavelength conversion element in Example 1.

FIG. 22 shows the result of XRD measurement (ω scan) of the wavelength conversion element of Example 1 in which the tilt (tilt of a crystal axis) of zinc oxide (002) was evaluated by an X-ray rocking curve method. In this measurement, by fixing 2θ (location of a detector) and rotating only the sample, the distribution of the crystal orientations is measured, which is an index of the extent of the uniformity of the crystal orientation. With this, the tilt of the c-axis of zinc oxide was evaluated. As shown in FIG. 22, the FWHM of the rocking curve of zinc oxide (002) in Example 1 was 2.7°. This is defined as the tilt of the c-axis of zinc oxide in the phosphor layer.

The FWHMs of the rocking curve of zinc oxide (002) of the wavelength conversion elements of Example 2 to Example 4 were measured in a similar method. The result of those measurements is shown in Table 2. Further, the FWHMs of the rocking curves of the thin films of zinc oxide (002) on the glass substrates in Example 1 to Example 4 were measured in a similar method. This is defined as the tilt of tire c-axis of the ZnO underlayer. The result of those measurements is shown in Table 2.

Note that, based on the result of XRD measurement (2θ/ω scan) of the ZnO underlayers on the glass substrates and of the wavelength conversion elements of Example 1 to Example 4, it was able to be confirmed that, in all of those cases, zinc oxide was in the c-axis orientation.

Table 2 covers the result of the tilts of the c-axes of zinc oxide in the phosphor layers and of the light emission intensities of the LED elements.

TABLE 2

| | Tilt of c-axis of thin film (ZnO underlayer) | Tilt of c-axis of zinc oxide forming matrix in phosphor layer | Light emission intensity |
|---|---|---|---|
| Example 2 | 5.5 | 5.0 | 95 |
| Example 3 | 4.5 | 4.0 | 112 |
| Example 4 | 4.2 | 2.9 | 117 |
| Example 1 | 4.0 | 2.7 | 120 |
| Comparative Example 1 | — | — | 100 |

The weight per unit area of the phosphor was see equal in all of the samples. In Table 2, for the sake of easy understanding, the examples are listed in descending order of tilt of the c-axis of zinc oxide in the phosphor layer. The light emission intensities of the LED elements other than the LED element of Comparative Example 1 are expressed supposing that the fight emission intensity of trie LED element of Comparative Example 1 is 100.

A correlation is observed between the tilt of the c-axis of zinc oxide in the phosphor layer and the light emission intensify of the LED element. As the tilt of the c-axis of zinc oxide in the phosphor layer became smaller, the light emission intensity of the LED element was improved, further, a correlation is also observed run woes the tilt of the c-axis of zinc oxide in the phosphor layer and the tilt of the c-axis of the thin film, of zinc oxide. As the tilt of the c-axis of the thin film of zinc oxide became smaller, the tilt of the c-axis of zinc oxide in the phosphor layer became smaller. This is thought to be because zinc oxide in the phosphor particle lever grew along the c-axis direction or the thin, film of zinc oxide with the thin film, of zinc oxide being the seed crystal.

As shown in Table 2, when the tilt of the c-axis of zinc oxide as the matrix in the phosphor layer was 4.0° or less, the light emission intensity was improved compared with the light emission intensify of the LSD element of Comparative Example 1 using the phosphor layer in which the phosphor particles were dispersed in the silicone resin. Further, it was found that, in order to cause the tilt of the c-axis of zinc oxide in the phosphor layer to be 4.0° or less, it was only necessary to set the tilt of the c-axis of the thin film to 4.5° or less.

Further, according to Example 4, the tilt of the c-axis of zinc oxide in the phosphor layer may be 2.9° or less, and, an that case, the tilt of the c-axis of the thin film of zinc oxide may be 4.2° or less. Further, according to Example 1, the tilt of the c-axis of zinc oxide in the phosphor layer may be 2.7° or less, and in that case, the tilt of the c-axis of the ZnO underlayer may be 4.0° or less.

In order to observe in more detail the voids in the phosphor layer, a focused ion beam (FIB) was used to process a section of the phosphor layer and observation was trade under a SEM.

Figure 23B:
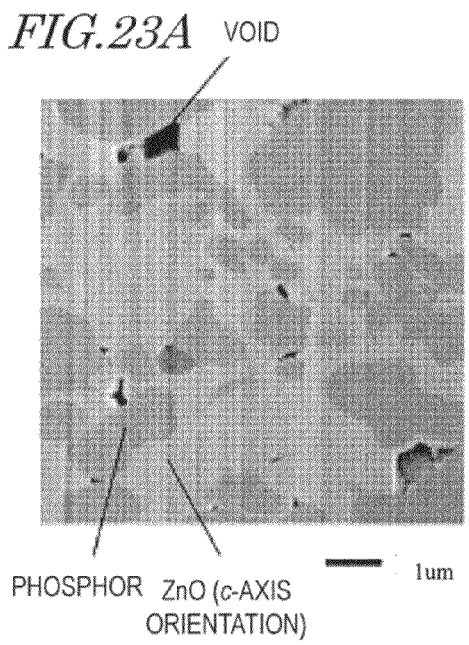
Figure 23B:
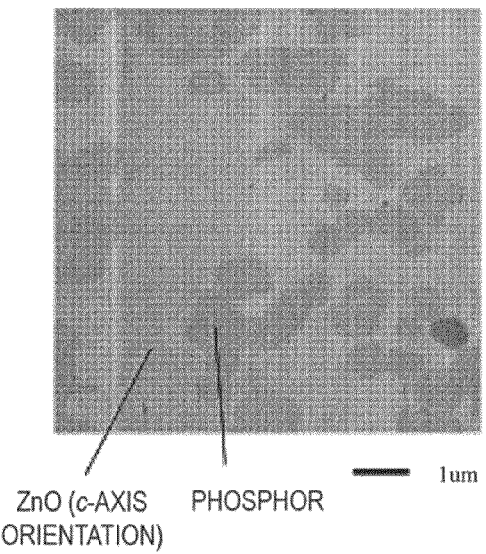

FIG. 23A is an image observed under a SEM of the phosphor layer in Example 2, and FIG. 23B is an image observed under a SEM of the phosphor layer in Example 1. As shown in FIG. 23A, in the phosphor layer of Example 2, a void was observed above a phosphor particle. As is clear from FIG. 23B, the number of the voids in Example 1 was smaller than that in Example 2, and it was able to be confirmed that the voids were inhibited.

Figure 24A:
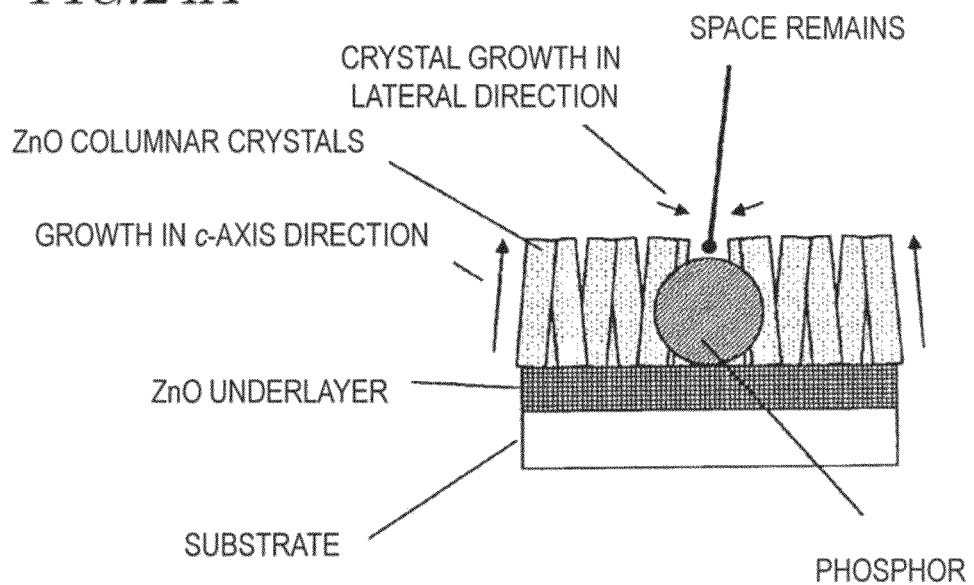
FIGS. 24A and 24B are sectional views showing a crystal growth process of zinc oxide using solution growth in a phosphor particle layer, and illustrate a case in which the tilt of the c-axis of the zinc oxide in a phosphor layer is large and a case in which the tilt of the c-axis of the zinc oxide in the phosphor layer is small, respectively.
Figure 24B:
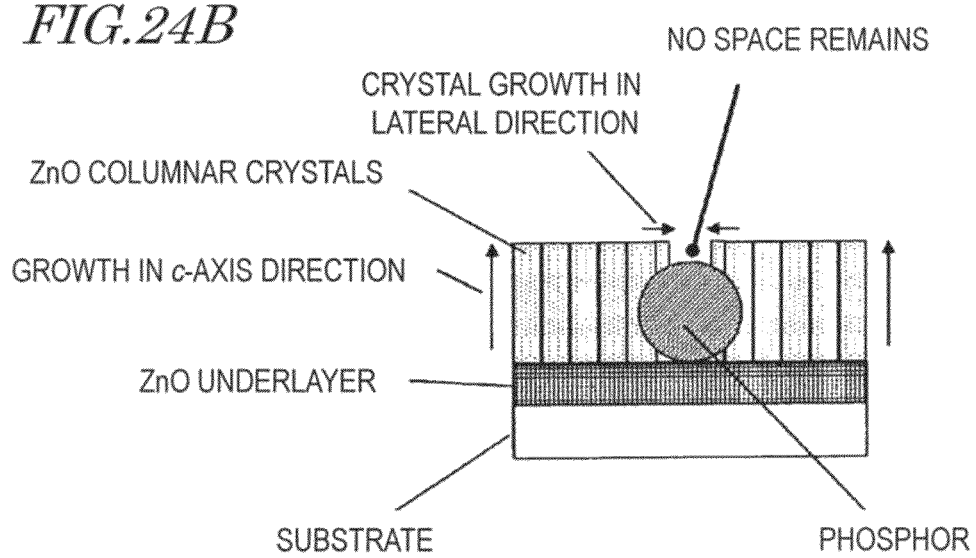

The detailed reason why there is a correlation between the tilt of the c-axis of zinc oxide in the phosphor layer and the light emission intensity of the LED element as described above is unknown, but the following reason can be thought. FIG. 24 are schematic views in the process of embedding the phosphor particles in zinc oxide by solution growth. FIG. 24A illustrates a case in which the tilt of the c-axis of zinc oxide in the phosphor layer is large, and FIG. 24B illustrates a ease in which the tilt of the c-axis of zinc oxide in the phosphor layer is small. For the sake of easy understanding, in the figures, the number of the phosphor particles is simplified to be one. In growing zinc oxide by solution growth, the phosphor cancel be a seed crystal, and zinc oxide is not directly crystal grown from phosphor particles. Zinc oxide in the phosphor layer is crystal grown from the ZnO underlayer in the c-axis direction. When zinc oxide which is crystal grown in the c-axis direction from, below the phosphor particles hits the phosphor particles, the crystal growth thereof stops there.

Zinc oxide is crystal grown in a horizontal direction (lateral direction) above the phosphor particles to embed the phosphor particles. With thought being given in this way, when the tilt of the c-axis of the ZnO underlayer is large, the tilt of the c-axis of zinc oxide in the phosphor layer is large. When the tilt of the c-axis of zinc oxide in the phosphor layer is large, the direction of the crystal growth in the lateral direction of zinc oxide is nonuniform and thus, when the phosphor particles are embedded in zinc oxide, voids remain above the phosphor particles. When the tilt of the c-axis of the ZnO underlayer is small, the tilt of the c-axis of zinc oxide in the phosphor layer is small. When the tilt of the c-axis of zinc oxide in the phosphor layer is small, the direction of the crystal growth in the lateral direction of zinc oxide is uniform, surd thus, when the phosphor particles are embedded in zinc oxide, no void remains above the phosphor particles. In this way, by decreasing tire tilt of the c-axis of zinc oxide which fills the spaces among phosphor particles, the voids in the phosphor layer were able to be inhibited.

Example 5

As the substrate, a c-plane sapphire substrate having a single crystalline GaN thin film in the c-axis orientation formed thereon was prepared. The thickness of the sapphire substrate was 0.43 mm and the thickness of the GaN thin film was 5 μm. A single crystalline ZnO underlayer in the c-axis orientation was formed on the GaN/sapphire substrate by solution growth. As the solution growth of zinc oxide, chemical bath deposition was used. As the zinc oxide growing solution, an aqueous solution in which zinc nitrate (0.1 mol/L) and hexamethylene tetramine (0.1 mol/L) were dissolved was prepared. The solution had pH value of 5 to 7. The above-mentioned substrate was immersed in the zinc oxide growing solution and the temperature of the zinc oxide growing solution was held at 30° C. to grow single crystalline zinc oxide by 0.7 μm on the GaN thin film/sapphire substrate. After this, the substrate was taken out, was cleaned with pure water and was dried.

After that, an LED element was completed by a method similar to that used in Example 1, and the light emission intensity of the entire radiant flux of the LED element was measured. The result is shown in Table 3. Note that, the weight per unit area of the phosphor was 3.3 mg/cm².

Comparative Example 4

As the substrate, c-plane sapphire substrate having a thickness of 0.43 mm was prepared. Then, an LED element was completed by a method similar to that used in Comparative Example 1, and the light emission intensity of the entire radiant flux of the LED element was measured. The result is shown in Table 3. Note that, the weight per unit area of the phosphor calculated similarly to the case of Comparative Example 1 was 3.3 mg/cm².

Figure 25:
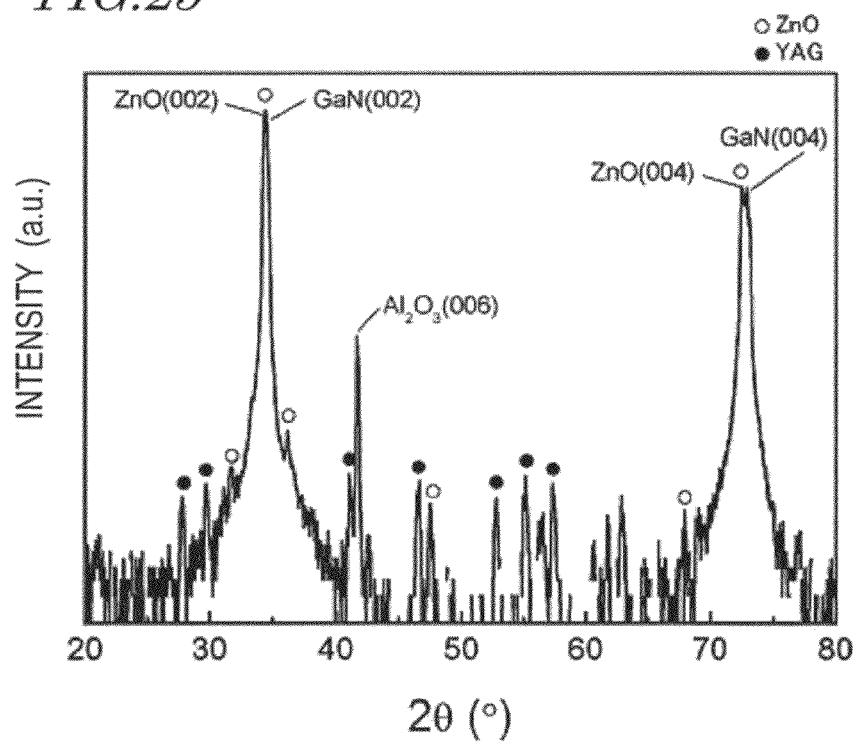
FIG. 25 is a graph showing the result of XRD measurement (2θ/ω scan) of a wavelength conversion element in Example 5.

FIG. 25 shoos the result of XPD measurement (2θ/ω scan) of the wavelength conversion element of Example 5. As shown in FIG. 25, compared with diffraction peaks of the phosphor or zinc oxide other than in the c-plane, significantly high peaks of zinc oxide (002) and zinc oxide (004) were detected. This enabled confirmation that zinc oxide in the phosphor layer of Example 5 had a significantly high degree of c-axis orientation. However, as shown in FIG. 25, zinc oxide and GaN have the same crystal structure and similar lattice constants, and thus, the peaks of zinc oxide and GaN are in proximity to each other with regard to both (002) and (004), and clear separation thereof is difficult.

Figure 26:
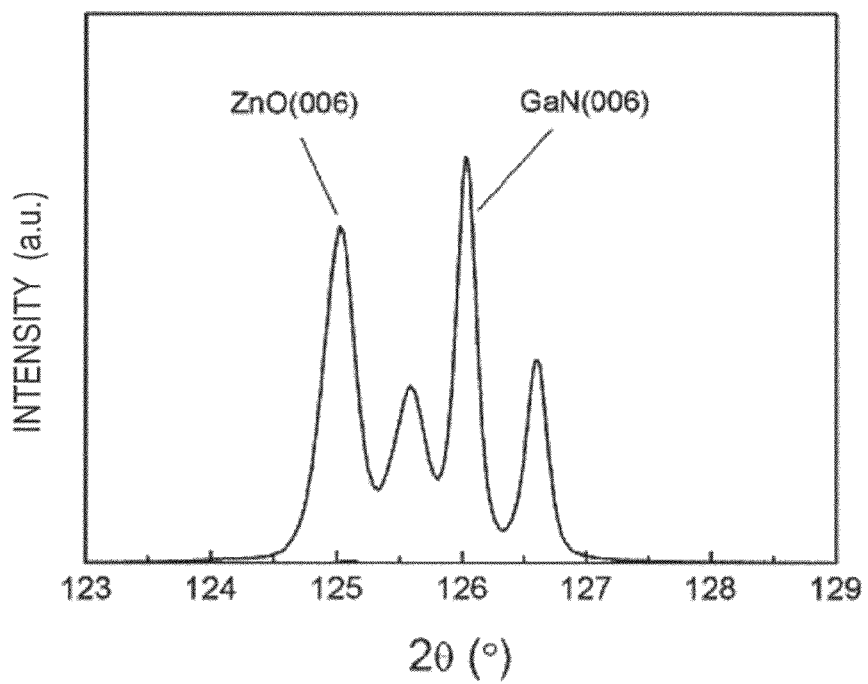
FIG. 26 is a graph showing the result of XRD measurement (2θ/ω scan) on a larger angle side of the wavelength conversion element in Example 5.

FIG. 26 shows the result of XPD measurement (2θ/ω scan) on a larger angle side of the wavelength conversion element of Example 5. As shown in FIG. 26, the peaks of zinc oxide (006) and of GaN (006) were detected in a clearly separate state.

Figure 27:
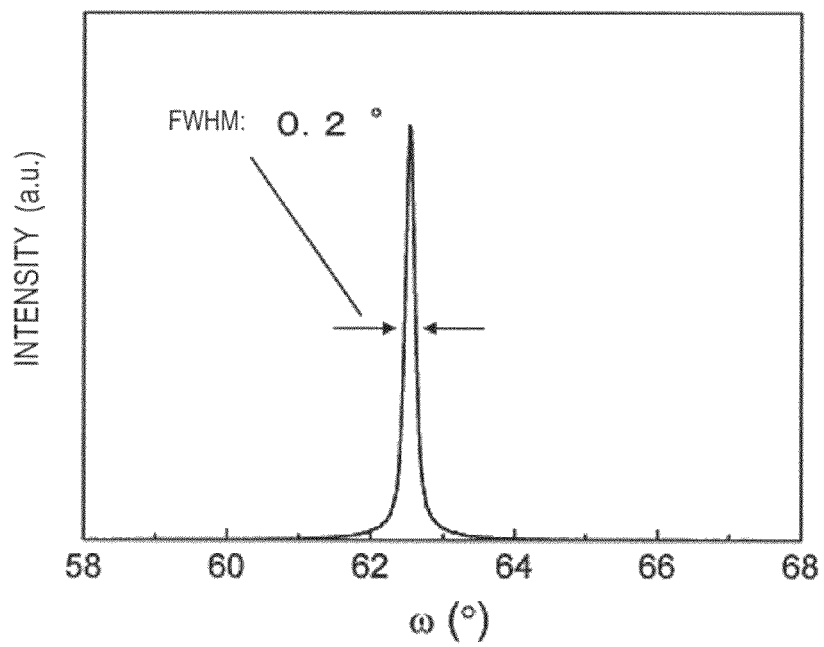
FIG. 27 is a graph showing she result of XRD measurement (ω scan) of the wavelength conversion element in Example 5.

FIG. 2 shows the result of XRD measurement (ω scan) of the wavelength conversion element of Example 5 in which the tilt (tilt of a crystal axis) of zinc oxide (006) was evaluated by an X-ray rocking curve method. With this, the tilt of the c-axis of zinc oxide was evaluated. As shown in FIG. 27, the FWKM of the rocking curve of zinc oxide (006) was 0.2°. This is defined as the tilt of the c-axis of zinc oxide in the phosphor layer. It was able so be confirmed that the tilt of the c-axis of zinc oxide of Example 5 was significantly small compared with that of zinc oxide of the columnar crystals of Example 1. Further, in a similar method, the FWHM of the rocking curve of zinc oxide (006) of the single crystalline ZnO underlayer on the Gad/sapphire substrate of Example 5 was measured. The FWHM was 0.2°. This is defined as the tilt of the c-axis of the ZnO underlayer. It was able to be confirmed that the tilt of the c-axis of the ZnO underlayer of Example 5 was also significantly small compared with that of the ZnO underlayer of Example 1. Note that, based on the result of XPD measurement (2θ/ω scan) of the single crystalline ZnO underlayer on the GaN/sapphire substrate of Example 5, it was able to be confirmed that zinc oxide was in the c-axis orientation.

Figure 28:
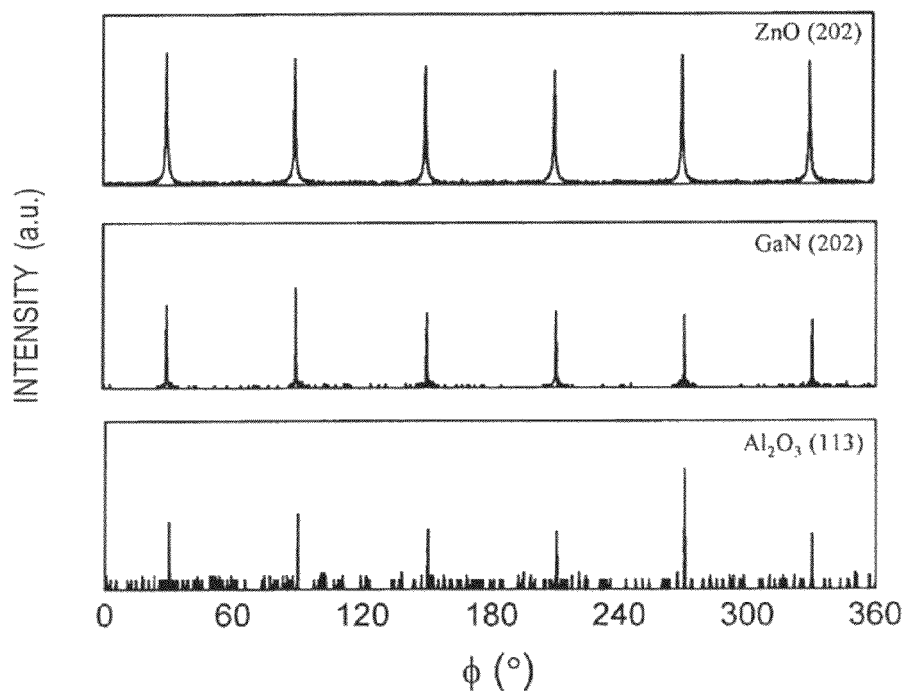
FIG. 28 is a graph showing the result of XRD measurement (Φ scan) of the wavelength conversion element in Example 5.

FIG. 28 shows the result of XRD measurement (Φ scan) of the wavelength conversion element of Example 5. In this measurement, by rotating the samples in an in-plane direction by 360°, the crystal orientation in the plane can be evaluated. Evaluation of zinc oxide (202), GaN (202), and Al₂O₃ (113) was made. As shown in FIG. 28, a pattern of hexagonal symmetry of zinc oxide appeared, and thus, it was confirmed that zinc oxide in the phosphor layer was a single crystal in a uniform crystal orientation. Further, all the locations of she peaks of Al₂O₃ of the sapphire substrate, the locations of the peaks of GaN, and the locations of the peaks of zinc oxide were coincident with one another, and thus, the crystal orientation of zinc oxide exhibited an epitaxial relationship with the crystal orientations of the sapphire substrate and of the dad thin film. It was able to be confirmed that zinc oxide was epitaxially grown with respect to the sapphire substrate and the GaN shin film.

Figure 29:
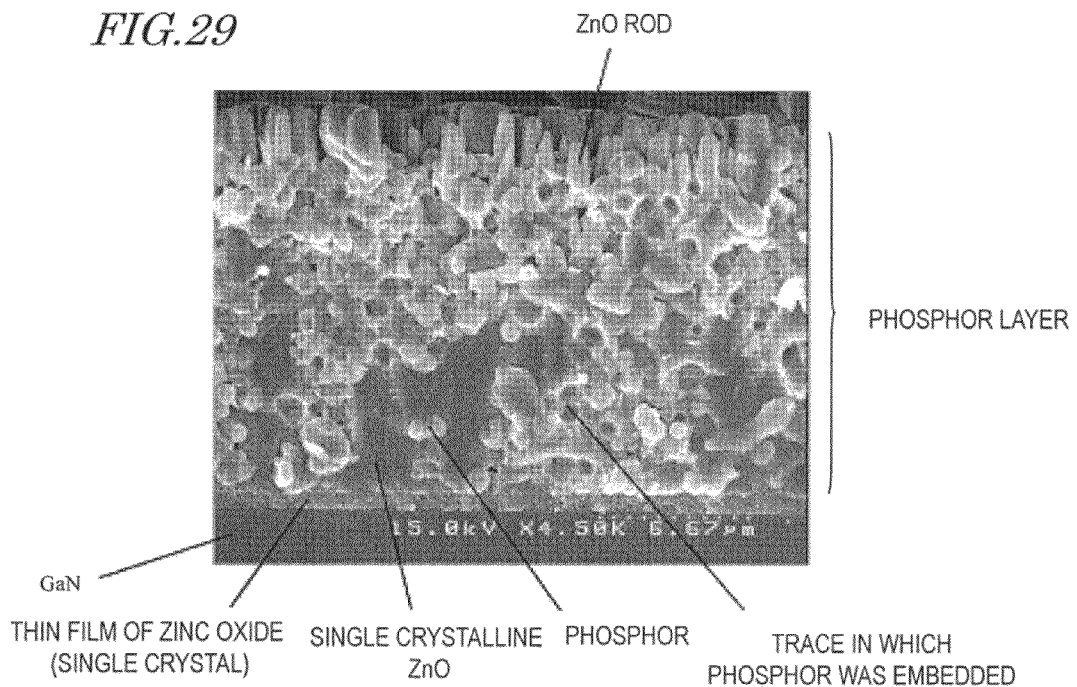
FIG. 29 is a photograph of an image observed under a SEM of a section of a phosphor layer in Example 5.
Figure 30:
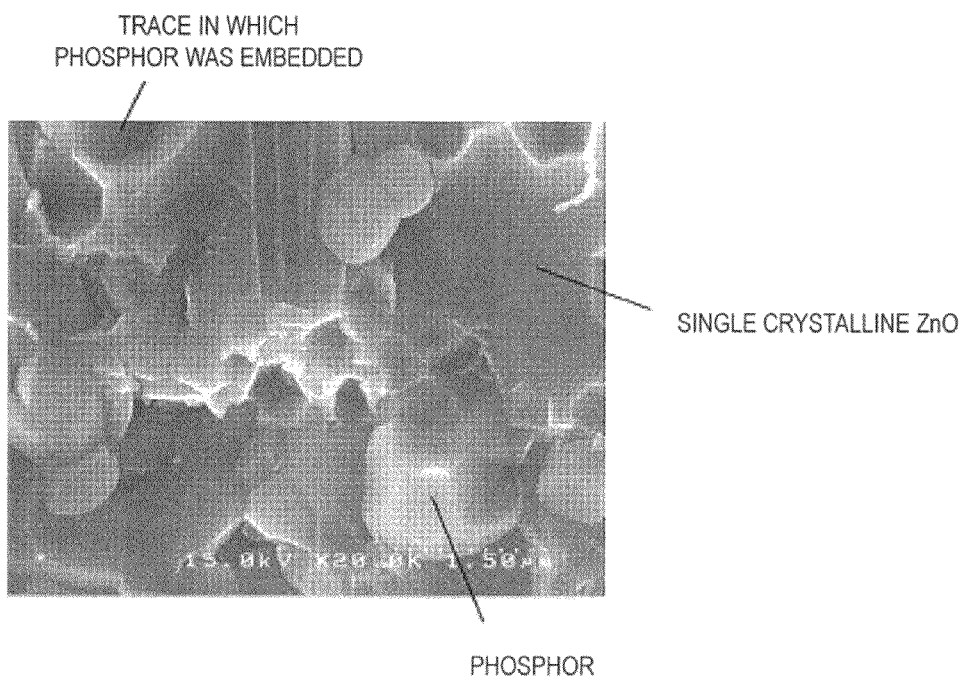
FIG. 30 is a photograph of an imago observed under a SEM of a section of the phosphor layer around the center in Example 5.

FIG. 29 is an image observed under a SEM of a section of the phosphor layer of Example 5. FIG. 30 is an enlarged image observed under a SEM of a section of the phosphor layer around the center of Example 5. A, sample is observed in a fracture cross-section of the phosphor layer, and thus, places which look like round recesses in the observed image are traces in which the phosphor particles were embedded, and the phosphor is thought to be on a plane on an opposite side of the ruptured sample. As shown in FIG. 29, the zinc oxide rods grew on the surface of the phosphor layer, and unevenness by the zinc oxide rods was able to be formed in a self-organizing manner. As clear from FIG. 29 and FIG. 30, it was able to be confirmed that the inside of the phosphor layer was densely filled with zinc oxide over the entire phosphor layer. Further, differently from the case of the phosphor layer of Example 1, no grain boundary was observed with regard to zinc oxide of Example 5. This is because zinc oxide was epitaxially grown from the single crystalline ZnO underlayer, and thus, the inside of the phosphor layer was able to be densely billed with single crystalline zinc oxide having no grain boundary.

Figure 31:
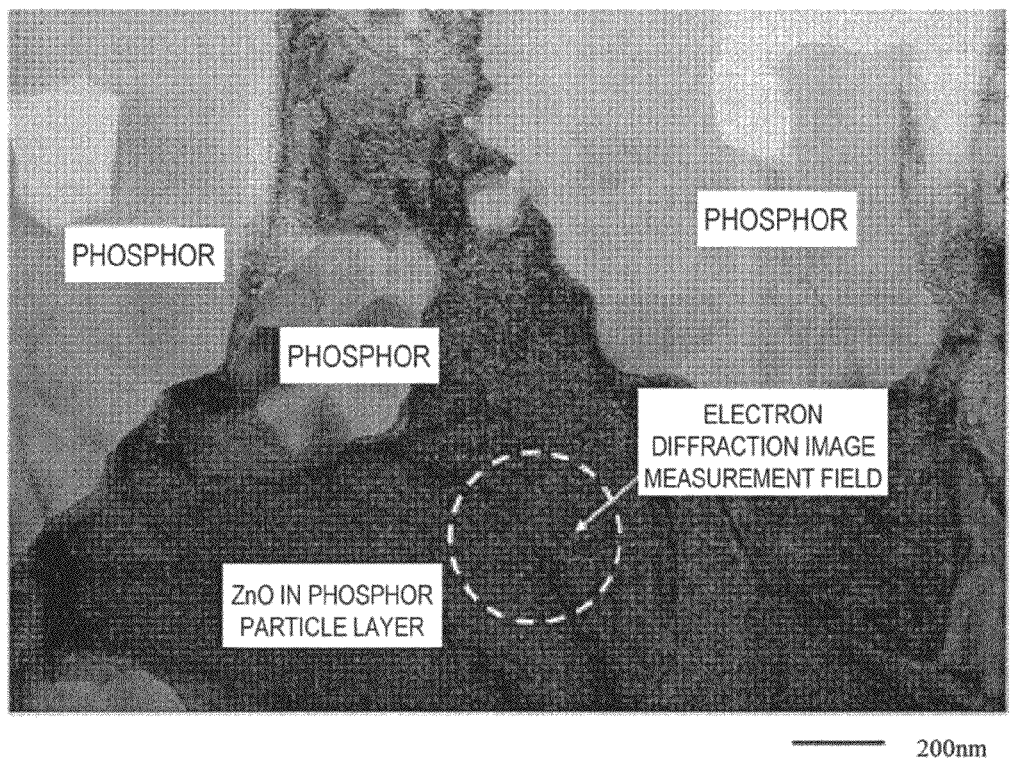
FIG. 31 is a photograph of an image observed under a transmission electron microscope (TEM) of a section of the phosphor layer in Example 5.

FIG. 31 is an image observed under a TEM of a section of the phosphor layer of Example 5. As is clear from FIG. 31, it was able to be confirmed that, by using single crystalline zinc oxide in she c-axis orientation as the ZnO underlayer, the spaces among phosphor particles were able to be densely filled with zinc oxide.

Figure 32:
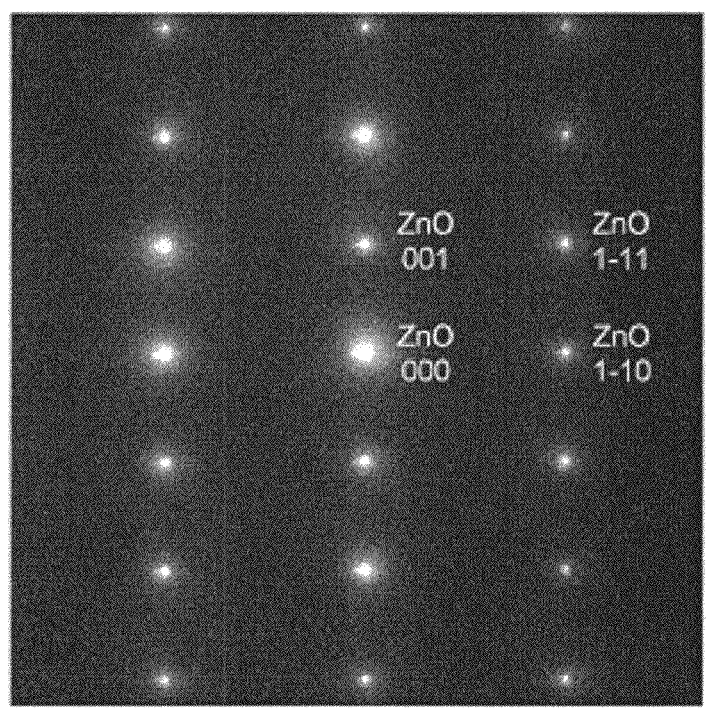
FIG. 32 is a photograph of an image of electron diffraction observed under a TEM in a range shown in FIG. 31.

FIG. 32 is a photomicrograph of an image of electron diffraction observed under a TEM in a range shown in FIG. 31. As shown in FIG. 32, clear diffraction, spots of zinc oxide were observed. This enabled confirmation that zinc oxide in the phosphor layer of Example 5 was single crystalline.

Table 3 covers the result of the light emission intensities of the LED elements of Example 5 and Comparative Example 4.

TABLE 3

| Sample | | Intensity of light emission |
|---|---|---|
| Example 5 | Phosphor + single crystalline zinc oxide | 127 |
| Comparative Example 4 | Phosphor + silicone resin | 100 |

The weight per unit area of the phosphor was set equal in all of the samples. The light emission intensity of the LED element other than the LED element of Comparative Example 4 is expressed supposing that the tight emission intensity of the LED element of Comparative Example 4 is 100. The light emission intensity of Example 5 was 127, and the obtained light emission intensity was 1.27 times as nigh as that of the LED element of Comparative Example 4 using the phosphor lawyer in which the phosphor particles were dispersed in the silicone resin. The light emission intensity in the case of Example 1 in which the inside of the phosphor layer was filled with zinc oxide columnar crystals in the c-axis orientation was 1.20 times as high as that in the case of Comparative Example 1. When those results are compared, in Example 5 in which the inside of the phosphor layer was filled with single crystalline zinc oxide, the light emission intensity was improved more than in Example 1 in which the inside of the phosphor layer was filled with zinc oxide columnar crystals. This is because the inside of the phosphor layer was able to be densely filled with single crystalline zinc oxide having no grain boundary. Therefore, light scattering in the phosphor layer was able to be inhibited more than in the case of the phosphor layer filled with zinc oxide columnar crystals.

Figure 33:
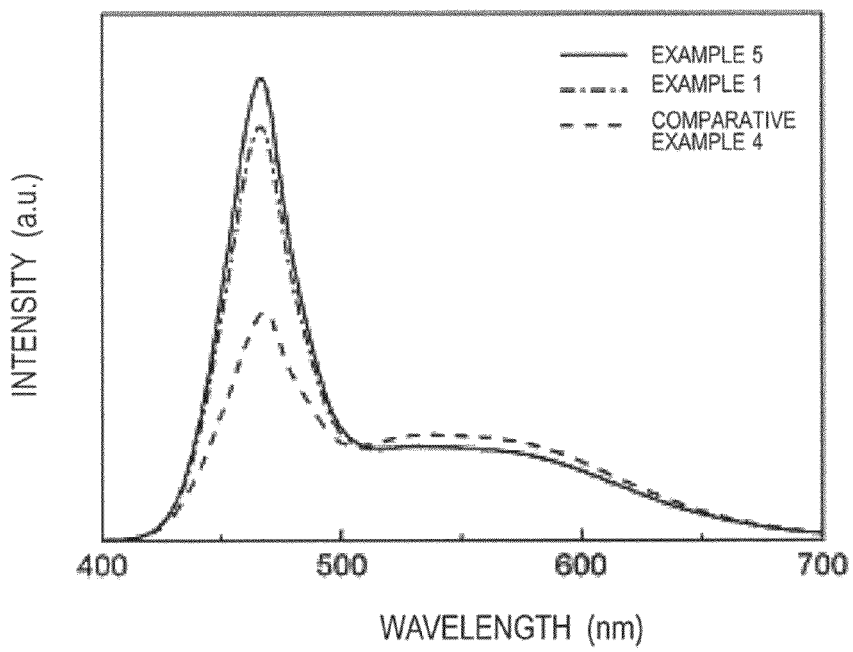
FIG. 33 is a graph showing the result of measurement of emission spectra of LED elements in Example 5, example 1, and Comparative Example 4, respectively.

FIG. 33 shows emission spectra of the LED elements of Example 5, Example 1, and Comparative Example 4, respectively. As shown in FIG. 33, in Example 5, the inside of the phosphor particle layer was able to be densely filled with single crystalline zinc oxide having no grain boundary, and thus, light scattering in the phosphor layer was able to be inhibited more than in the case of Example 1 and Comparative Example 1, and blue light from the LED chip was able so be taken outside of the LED element with efficiency.

Example 6

A plurality of blue LED chips having a light emission wavelength of 446 nm and having the same light emission intensity were prepared. Instead of the YAG:Ce Phosphor in Example 1, a β-SiAlON:Eu phosphor having a refractive index of 1.9 and an average particle diameter of 6 μm was used to form the phosphor layer in which the spaces among phosphor particles were filled with zinc oxide by a method similar to that used in Example 1. Note that, the thickness of the phosphor particle layer was about 30 μm, and the weight per unit area of the phosphor was 5.0 mg/cm². Further, an LED element was completed by a method similar to that used in Example 1, and the light emission intensity of the entire radiant flux of the LED element was measured. The result is shown in Table 4.

Comparative Example 5

Similarly to Example 6, blue LED chips having a light emission wavelength of 446 nm and having the same light emission intensity and the β-SiAlON:Eu phosphor having a refractive index of 1.9 and an average particle diameter of 6 μm were used to complete en LED element by a method similar to that used in Comparative Example 1, and the light emission intensity of the entire radiant flux of the LED element was measured. The result is shown in Table 4. Note that, the phosphor layer using a silicone resin had a thickness of 180 μm, the phosphor was 8.6 vol % in the phosphor layer, and the weight per unit area of the phosphor calculated similarly to the case of Comparative Example 1 was 5.0 mg/cm².

Figure 34:
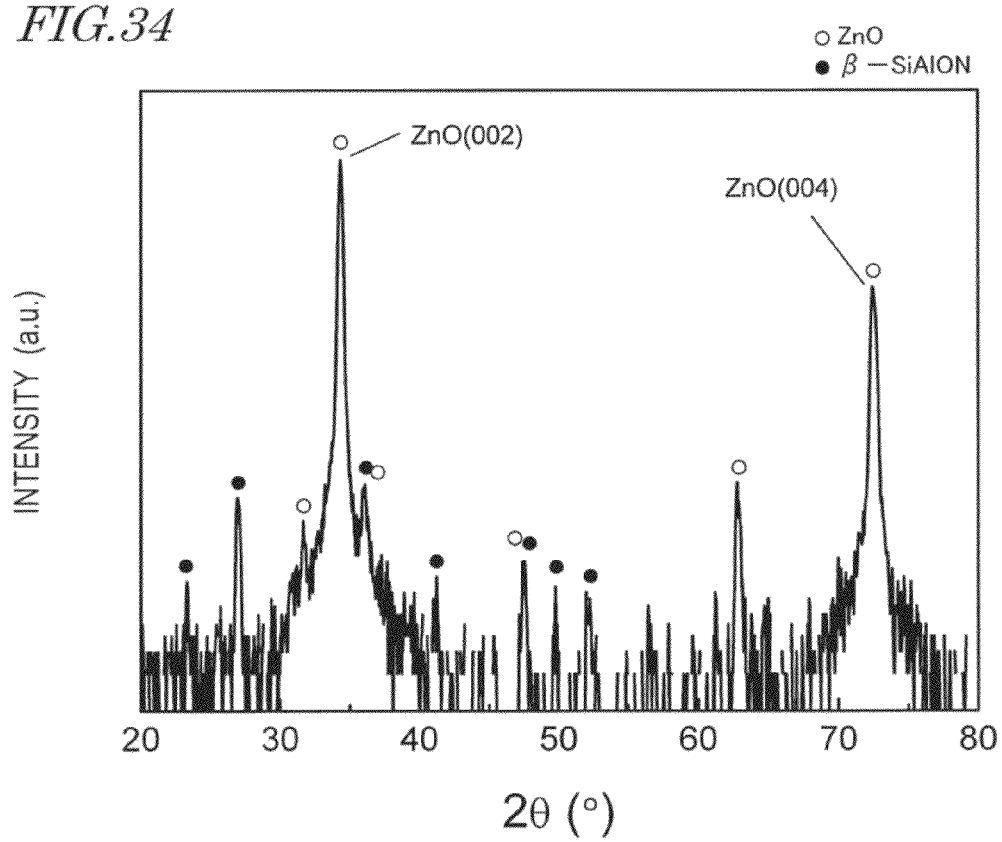
FIG. 34 is a graph showing the result of XRD measurement (2θ/ω scan; of a wavelength conversion element in Example 6.

FIG. 34 shows the result of XRD measurement (2θ/ω scan) of the wavelength conversion element of Example 6. As shown in FIG. 34, compared with diffraction peaks of she phosphor or zinc oxide other than in the c-plane, significantly high peaks of zinc oxide (002) and zinc oxide (004) were detected. This enabled confirmation that zinc oxide in the phosphor layer of Example 6 had a significantly high degree of c-axis orientation. Further, by a method similar to that used in Example 1, the FWHM of rocking curve of zinc oxide (002) of the wavelength conversion element of Example 6 was measured. The FWHM or the rocking curve of zinc oxide (002) of Example 6 was 2.5°.

Figure 35:
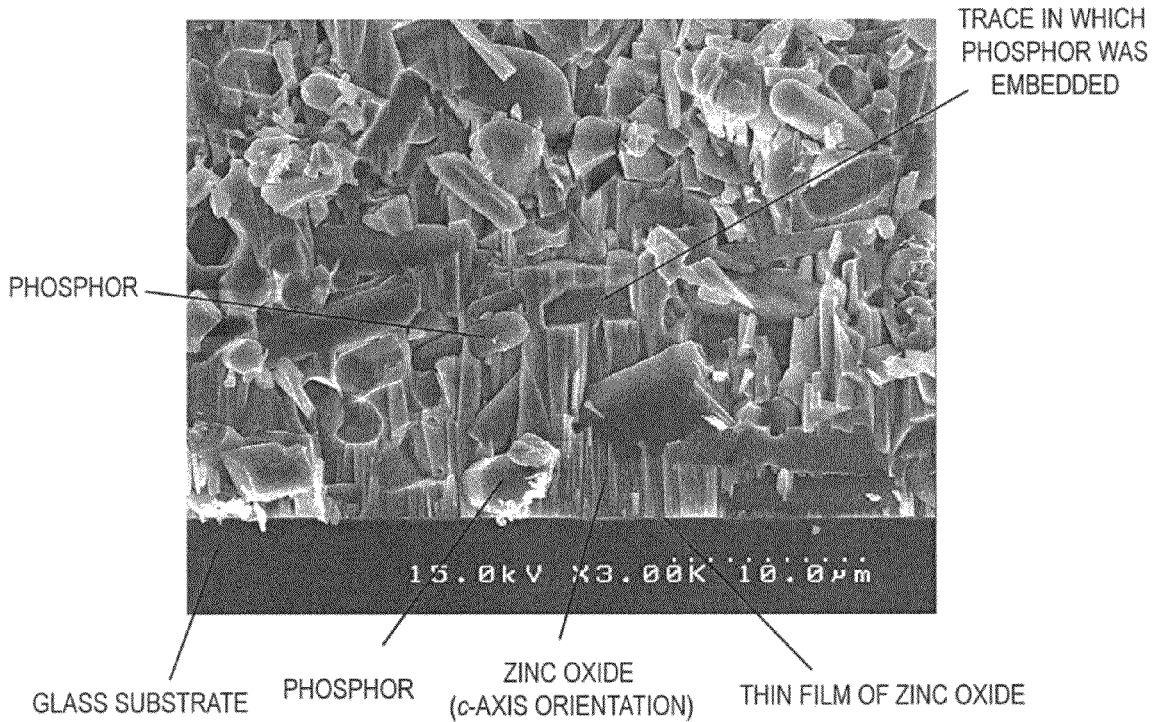
FIG. 35 is a photograph of an image observed under a SEM of a section of a phosphor layer around an interface with a substrate in Example 6

FIG. 35 is an image observed under a SEM of a section of the phosphor layer around an interface with the substrate of Example 6. A sample is observed in a fracture cross-section of the phosphor layer, and thus, places which lock like recesses in the observed image are traces in which the phosphor particles were embedded, and the phosphor is thought to be on a piano on an opposite side of the ruptured sample. As is clear from FIG. 35, the inside of the phosphor layer is densely filled with zinc oxide. Further, vertical grain boundaries are observed in zinc oxide in the phosphor layer. This shows that zinc oxide grew info column sir crystals by solution growth.

From FIG. 35, it can be seen a state in which zinc oxide is held in close contact with the ZnO underlayer, and zinc oxide is crystal grown from the ZnO underlayer so that zinc oxide columnar crystals fill space around the phosphor particles. This enabled confirmation that, even when β-SiAlON was used as the phosphor, zinc oxide columnar crystals having only a small number of grain boundaries were able to be arranged in the direction of light emission.

Table 4 covers the results of the light emission intensities of the LED elements of Example 6 and Comparative Example 5.

TABLE 4

| Sample | | Excitation source | Light emission intensity |
|---|---|---|---|
| Example 6 | Phosphor (β-SiAlON) + zinc oxide columnar crystals in c-axis orientation | LED chip Light emission wavelength 446 nm | 122 |
| Comparative Example 5 | Phosphor (β-SiAlON) + silicone resin | LED chip Light emission wavelength 446 nm | 100 |

The weight per unit area of the phosphor was set equal in the two samples. The light emission intensity of the LED element other than the LED element of Comparative Example 5 is expressed supposing that the fight emission intensity of the LED element of Comparative Example 5 is 100. The light emission intensity of Example 6 was 122, and the obtained light emission intensity was 1.2 times as high as that of the LED element of Comparative Example 5 using the phosphor layer in which the phosphor particles were dispersed in the silicone resin. This is because the inside of the phosphor layer was able to be densely filled with zinc oxide columnar crystals having only a small number of grain boundaries in the c-axis orientation. Therefore, light, scattering in the phosphor layer was able to be inhibited.

Figure 36:
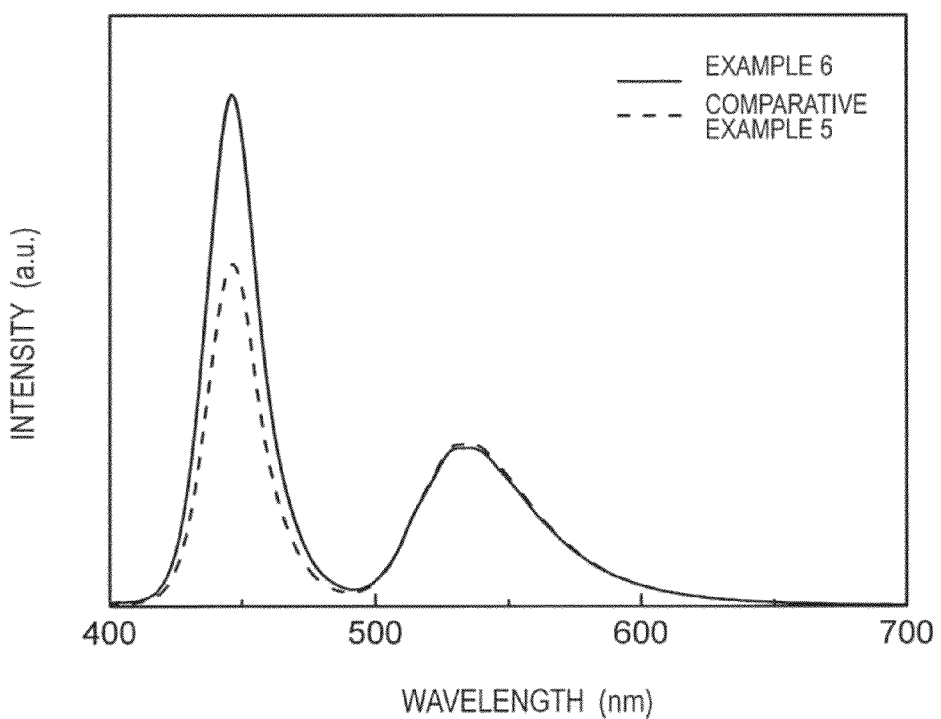
FIG. 36 is a graph showing the result of measurement of emission spectra; of LED elements in Example 6 and Comparative Example 5, respectively.

FIG. 36 shows emission spectra of the LED elements of Example 6 and Comparative Example 5, respectively. As shown in FIG. 38, in Example 6, the inside of the phosphor particle layer was able to be densely filled with zinc oxide columnar crystals in the c-axis orientation. Thus, light scattering in the phosphor layer was able to be inhibited more than in the case of Comparative Example 5, and excitation light from the LED chip was able to be taken outside of the LED element with efficiency.

Example 7

A plurality of semiconductor laser chips having a light emission wavelength of 446 nm and having the same light emission intensity were prepared. The phosphor layer in which the spaces among phosphor particles were filled with zinc oxide were formed by a method similar to that used in Example 1. Note that, the weight per unit area of the phosphor was 3.3 mg/cm². As illustrated in FIG. 13, the phosphor layer was cut by dicing so as to conform to the size of the opening 304 in the cap 303 to prepare an individualized wavelength conversion element. Further, the semiconductor laser chip was attached to the block 302 using solder, and bonding wires were used to electrically connect the semiconductor laser chip 310 and the leads 305 provided on the stem 301. Then, the opening 304 and ends of the individualized wavelength conversion element were fixed with an adhesive so that the substrate side was the side of the surface 308 from which light from the semiconductor laser light emitting device is emitted to complete the semiconductor laser light emitting device illustrated in FIG. 13. The completed semiconductor laser light emitting device was attached to an integrating sphere and driven by a constant current of 30 mA. Thus, the light emission intensity of the entire radiant flux of the semiconductor laser light emitting device was measured. The result is shown in Table 5.

Comparative Example 6

By a method similar to that used in Comparative Example 1, a phosphor layer in which the phosphor was dispersed in the silicone resin was formed after that, similarly to Example 7, semiconductor laser chips having a light emission wavelength of 446 nm and having the same light emission intensity were used to complete a semiconductor laser light emitting device, and the light emission intensity of the entire radiant flux of the semiconductor falser light emitting device was measured. The result is shown in Table 5. Note that, the phosphor layer using the silicone resin had a thickness of 90 μm, and the weight per unit area of the phosphor calculated similarly to the case of Comparative Example 1 was 3.3 rag/cm².

Table 5 covers the result of the light emission intensities of the semiconductor laser light emitting devices of Example 7 and Comparative Example 6.

TABLE 5

| Sample | | Ezcitation source | Intensity of light emission |
|---|---|---|---|
| Example 7 | Phosphor (YAG) + zinc oxide columnar crystals in c-axis orientation | Semiconductor laser chip Light emission wavelength 446 nm | 119 |
| Comparative Example 6 | Phosphor (YAG) + silicone resin | Semiconductor laser chip Light emission wavelength 446 nm | 100 |

The weight per unit area of the phosphor was set equal in the two samples. The light emission intensity of the semiconductor laser light emitting device other than the semiconductor laser light emitting device of Comparative Example 6 is expressed supposing that the light emission intensity of the semiconductor laser fight emitting device of Comparative Example 6 is 100. The light emission intensity of Example 7 was 119, and the obtained light emission intensity was 1.19 times as high as that of the semiconductor laser light emitting device of Comparative Example 6 using the phosphor layer in which the phosphor particles were dispersed in the silicone resin. This is because the inside of the phosphor layer was able to be densely filled with zinc oxide columnar crystals having only a small number of grain boundaries in the c-axis orientation. Therefore, light scattering in the phosphor layer was able to be inhibited.

Figure 37A:
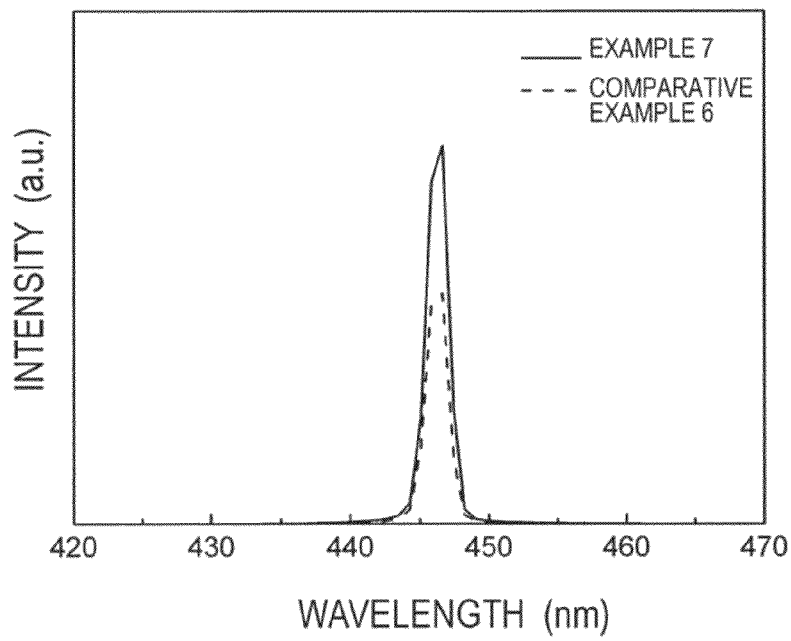
FIGS. 37A and 37B are enlarged graphs around excitation light from semi, conduct or laser chips and around fluorescence excited by excitation light, respectively, which show the result of measurement of emission spectra of semiconductor laser light emitting devices in Example 7 and Comparative Example 6, respectively.
Figure 37B:
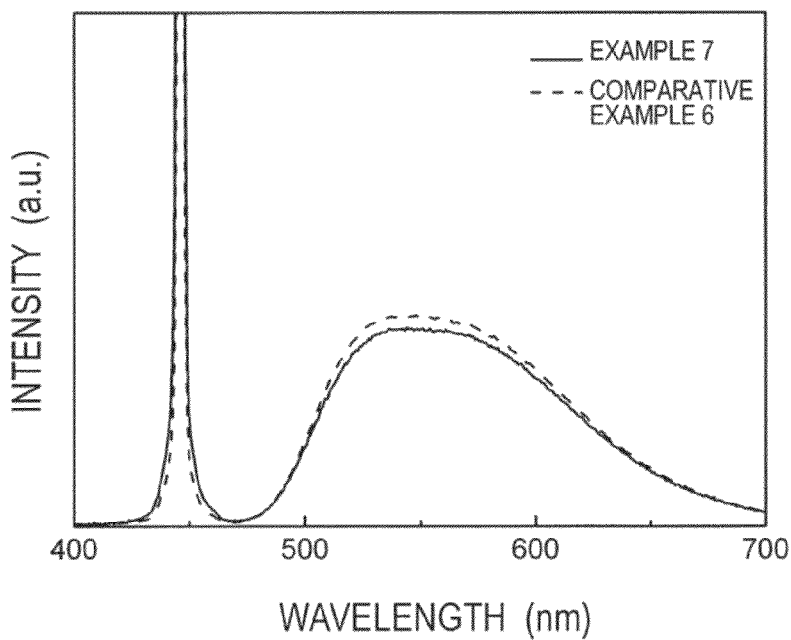

FIGS. 37A and 37B show emission spectra of the semiconductor laser light emitting devices of Example 7 and Comparative Example 6, respectively. FIG. 37A is an enlarged view around excitation light from the semiconductor laser chips, and FIG. 37B is an enlarged view around fluorescence excited by excitation light. As shown in FIGS. 37A and 37B, in Example 7, the inside of the phosphor particle layer was able to be densely filled with zinc oxide columnar crystals in the c-axis orientation, and thus, light scattering in the phosphor layer was able to be inhibited more than in the case of Comparative Example 6, and excitation light from the semiconductor laser chip was able to be taken outside of the semiconductor laser light emitting device with efficiency.

Example 8

The β-SiAlON:Eu phosphor having a refractive index of 1.9 and an average particle diameter of 6 μm was used to form the phosphor layer in which the spaces among phosphor particles were filled with zinc oxide by a method similar to that used in Example 6. Note that, the weight per unit area of the phosphor was 5.0 mg/cm². Further, by a method similar to that used in Example 7, a semiconductor laser light emitting device was completed, and the light emission intensity of the entire radiant flux of the semiconductor laser light emitting device was measured, the result is shown in Table 6.

Comparative Example 7

The β-SiAlOH:Eu phosphor having a refractive index of 1.9 and an average particle diameter of 6 μm was used to complete the phosphor layer in which the phosphor was dispersed in she silicone resin by a method similar to that used in Comparative Example 5. After that, by a method similar to that used in Example 7, a semiconductor laser light emitting device was completed, and she light emission intensity of the entire radiant flux of the semiconductor laser light emitting device was measured. The result is shown in Table 6. Note that, the phosphor layer using she silicone resin had a thickness of 180 μm, and the weight per unit area of the phosphor calculated similarly to the case of Comparative Example 1 was 5.0 mg/cm².

Table 6 covers the result of the light emission intensities of the semiconductor laser light emitting devices of Example 3 and Comparative Example 7.

TABLE 6

| Sample | | Excitation source | Light emission intensity |
|---|---|---|---|
| Example 8 | Phosphor (β-SiAlON) + zinc ozide columnar crystals in c-axis orientation | Semiconductor laser chip Light emission wavelength 446 nm | 141 |
| Comparative Example 7 | Phosphor (β-SiAlON) + silicone resin | Semiconductor laser chip Light emission wavelength 446 nm | 100 |

The weight per unit area of the phosphor was set equal in the two samples. The light emission intensity of the semiconductor laser light emitting device other than the semiconductor laser light emitting device of Comparative Example 7 is expressed supposing that the light emission intensity of the LED element of Comparative Example 7 is 100. The light emission intensity of Example 8 was 141, and the obtained light emission intensity was 1.41 times as high as that of the semiconductor laser Light emitting device of Comparative Example 7 using the phosphor layer in which the phosphor particles were dispersed in the silicone resin. This is because the inside of the phosphor layer was able to be densely filled with zinc oxide columnar crystals having only a small number of grain boundaries in the c-axis orientation. Therefore, light scattering in the phosphor layer was able to be inhibited.

Figure 38A:
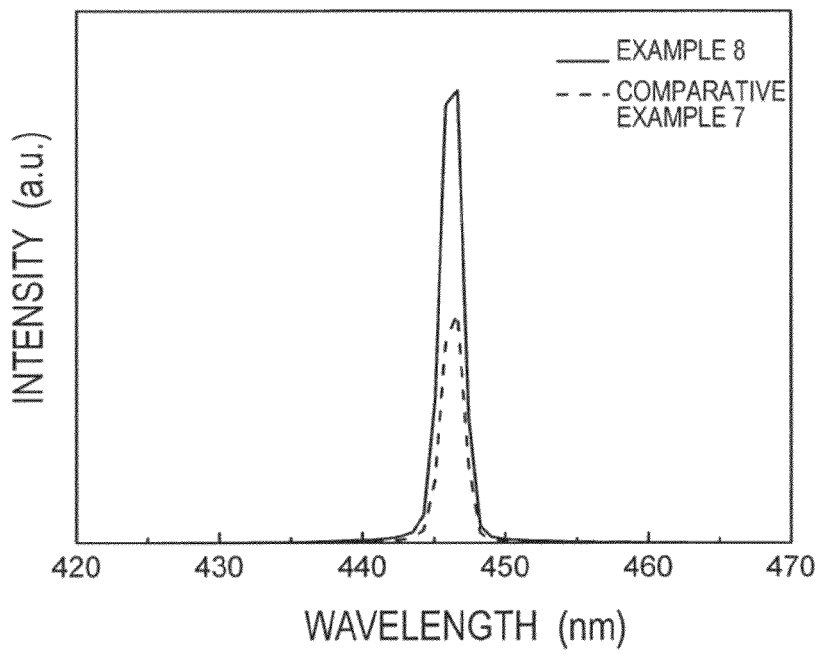
FIGS. 38A and 38B are enlarged graphs around excitation light from semiconductor laser chips and around fluorescence excited by excitation light, respectively, which show the result of measurement of emission spectra of semiconductor laser light emitting devices in Example 8 and Comparative Example 7, respectively.
Figure 38B:
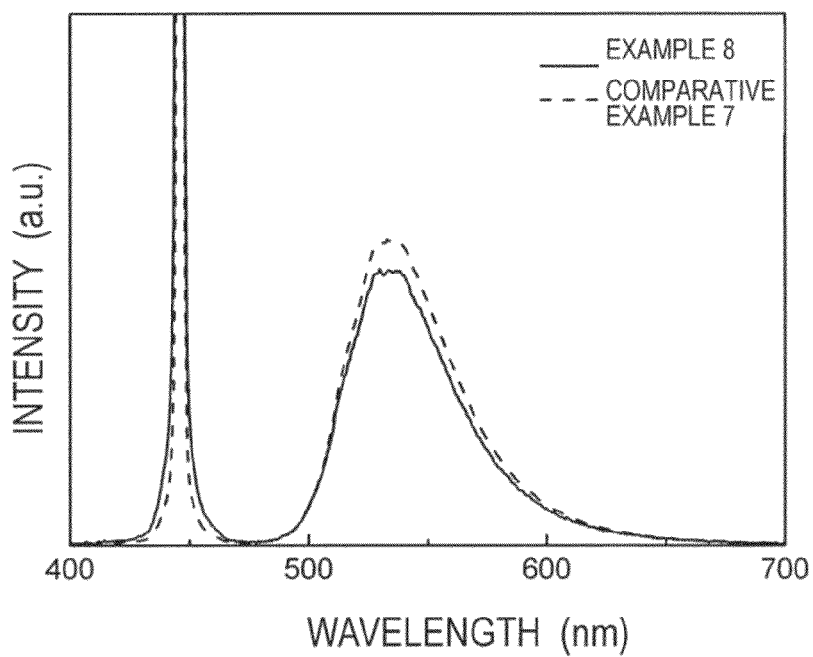

FIGS. 38A, and 38B show emission spectra of the semiconductor laser light emitting devices of Example 8 and Comparative Example 7, respectively. FIG. 38A is an enlarged view around excitation light from the semiconductor laser chips, and FIG. 38B is an enlarged view around fluorescence excited by excitation light. As shown in FIGS. 38A and 38B, in Example 8, the inside of the phosphor particle layer was able to be densely filled with zinc oxide columnar crystals in the c-axis orientation. Thus, light scattering in the phosphor layer was able to be inhibited more than in the case of Comparative Example 7, and excitation light from the semiconductor laser chip was able to be taken outside of the semiconductor laser light emitting device with efficiency, Example 9

A plurality of blue LED chips having a light emission wavelength of 430 nm and having the same light emission intensity were prepared. An LED element was completed by a method similar to that used in Example 1, and the light emission intensify of the entire radiant flux of she LED element was measured. Mote that, the weight per unit area of the phosphor was 3.3 mg/cm². The result is shown in Table 7.

Comparative Example 8

Similarly to the case of Example 3, blue LED chips having a light emission wavelength of 430 nm and having the same light emission intensity were used to complete an LED element by a method similar to that used in Comparative Example 1, and the light emission intensity of the entire radiant flux of the LED element was measured. The result is shown in Table 7. Note that, the phosphor layer using the silicone resin had a thickness of 90 µm, and the weight per unit area of the phosphor calculated similarly to the case of Comparative Example 1 was 3.3 mg/cm². Table 7 covers the result of the light emission intensities of the LED elements of Example 9 and Comparative Example 8.

TABLE 7

| Sample | | Excitation source | Light emission intensity |
|---|---|---|---|
| Example 9 | Phosphor (YAG) + zinc oxide columnar crystals in c-axis orientation | LED chip Light emission wavelength 430 nm | 112 |
| Comparative Example 8 | Phosphor (YAG) + silicone resin | LED chip Light emission wavelength 430 nm | 100 |

The weight per unit area of the phosphor was set equal in the two samples. The light emission intensity of the LED element other than she LED element of Comparative Example 8 is expressed supposing that the light emission intensity of the LED element of Comparative Example 8 is 100. The light emission intensity of Example 3 was 112, and the obtained light emission intensity was 1.12 times as nigh as that of the LED element of Comparative Example 8 using the phosphor layer in which the phosphor particles were dispersed in the silicone resin. This is because the inside of the phosphor layer was able to be densely filled with zinc oxide columnar crystals having only a small number of grain boundaries in the c-axis orientation. Therefore, light scattering in the phosphor layer was able to be inhibited.

Example 10

A plurality of blue LED chips having a light emission wavelength of 430 nm and having the same light emission intensity were prepared. The β-SiAlON:Eu phosphor having a refractive index of 1.9 and an average particle diameter of 6 µm was used to complete an LED element by a method similar to that used in Example 6, and the light emission intensity of the entire radiant flux of the LED element was measured. Note that, the weight per unit area of the phosphor was 5.0 mg/cm². The result is shown in Table 8.

Comparative Example 9

Similarly to the case of Example 10, blue LED chips having a light emission wavelength of 430 nm and having the same light emission intensity and the β-SiAlON:Eu phosphor having a refractive index of 1.3 and an average particle diameter of 6 µm were used to complete an LED element by a method similar so that used in Comparative Example 5, and the light emission intensity of the entire radiant flux of the LED element was measured. The result is shown in Table 8. Note that, the phosphor layer using the silicone resin had a thickness of 180 µm, and the weight per unit area of the phosphor calculated similarly to she case of Comparative Example 1 was 3.0 mg/cm².

Table 8 covers the result of the light emission intensities of the LED elements of Example 10 and Comparative Example 9.

TABLE 8

| Sample | | Excitation source | Light emission intensity |
|---|---|---|---|
| Example 10 | Phosphor (β-SiAlON) + zinc oxide columnar crystals in c-axis orientation | LED chip Light emission wavelength 430 nm | 115 |
| Comparative Example 9 | Phosphor (β-SiAlON) + silicone resin | LED chip Light emission wavelength 430 nm | 100 |

The weight per unit area of the phosphor was set equal in the two samples. The light emission intensity of the LED element other than the LED element of Comparative Example 9 is expressed supposing that the light emission intensity of the LED element of Comparative Example 9 is 100. The light emission intensity of Example 10 was 115, and the obtained light emission intensity one 1.15 times as high as that of the LED element of Comparative Example 9 using the phosphor layer in which the phosphor particles were dispersed in the silicone resin. This is because the inside of the phosphor layer was able to be densely filled with zinc oxide columnar crystals having only a small number of grain boundaries in the c-axis orientation. Therefore, light scattering in the phosphor layer was able to be inhibited.

(Evaluation of Transmittance of Zinc Oxide)

On a glass substrate having the ZnO underlayer formed thereon, which was the same as that used in Example 1, the phosphor particle layer was not formed, and only a zinc oxide film was formed by crystal growth using solution growth which was similar to that used in Example 1. The thickness of the zinc oxide film was about 20 µm. The transmittance of the zinc oxide film was measured using, as a reference in a wavelength range of 330 nm to 800 nm, a glass substrate net having the zinc oxide film formed thereon. The ZnO underlayer was formed also on a sapphire substrate instead of the glass substrate by a method similar to that used in Example 1, and a zinc oxide film of about 20 µm was formed by solution growth which was similar to that used in Example 1. The transmittance of the zinc oxide film on the sapphire substrate was also measured similarly using a sapphire substrate as a reference.

Figure 39:
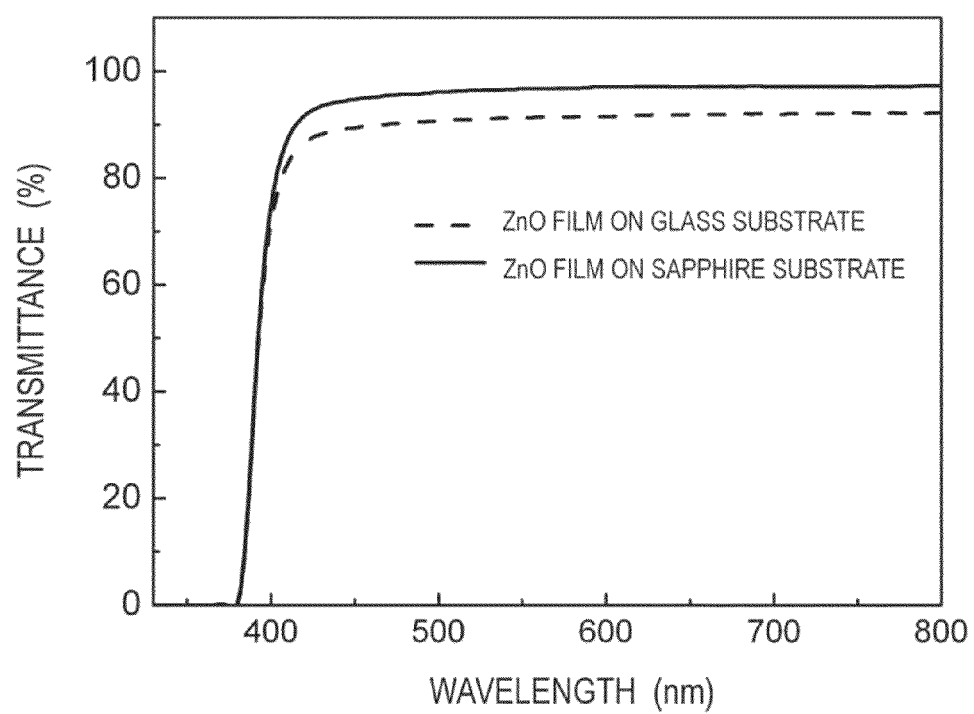
FIG. 39 is a graph showing the result of measurement of transmission spectra of zinc oxide films on a glass substrate and on a sapphire substrate, respectively.

FIG. 39 shows transmittance spectra of zinc oxide films on a glass substrate and on a sapphire substrate, respectively. When the wavelength was 470 nm, the transmittance of the zinc oxide film oxide the glass substrate was 90%, and the transmittance of the zinc oxide film on the sapphire substrate was 95%. When the wavelength was 430 nm, the transmittance of the zinc oxide film on the glass substrate was 88%, and the transmittance of the zinc oxide film on the sapphire substrate was 94%. When the wavelength, was 420 nm, the transmittance of the zinc oxide film on the glass substrate was 87%, and the transmittance of the zinc oxide film on the sapphire substrate was 92%. When the wavelength was 400 nm, the transmittance of the zinc oxide film on the glass substrate was 72%, and the transmittance of the zinc oxide film on the sapphire substrate was 73%.

The transmittance of she zinc oxide film formed by solution growth is significantly high, and the transmittance is 72% or more in the wavelength range of 400 nm to 420 nm of blue-violet fight. Thus, even when the excitation light is blue-violet light, the phosphor layer according to the present invention can be excited. Further, in the wavelength range of 420 nm to 470 nm of blue light, the transmittance is 87% or more. Thus, the phosphor layer according to the present invention can be excited more efficiently when the excitation light is blue light than when the excitation light is blue-violet light.

As can be understood from the above-mentioned examples of experiment, with regard to the phosphor layer in which the spaces among phosphor particles were filled with zinc oxide columnar crystals in the c-axis orientation with the tilt of the c-axis being 4° or less, light scattering in the phosphor layer was inhibited, and the LED element using the wavelength conversion element including the phosphor layer attained high light emission intensity.

Further, the phosphor layer in which the spaces among phosphor particles were filled with single crystalline zinc oxide had no grain boundary, and light scattering in the phosphor layer was inhibited more than in the case of the phosphor layer in which the spaces among phosphor particles were filled with zinc oxide columnar crystals. The LED element using the wavelength conversion element including the phosphor layer attained still higher light emission intensity. Further, with regard to the phosphor layer in which the spaces among phosphor particles were filled with zinc oxide columnar crystals in the c-axis orientation with the tilt of the c-axis being 4° or less, light scattering in the phosphor layer was inhibited, and the semiconductor laser light emitting device using the wavelength conversion element including the phosphor layer attained high light emission intensity.

Further, the phosphor layer in which the spaces among phosphor particles were filled with sane oxide columnar crystals in the c-axis orientation with the tilt of the c-axis being 4° or less inhibited, not only when the YAG phosphor was used as the phosphor but also when the β-SiAlON phosphor was used as the phosphor, light scattering in the phosphor layer, and the LED element and the semiconductor laser light emitting device using the wavelength conversion element including the phosphor layer attained high light emission intensity.

The wavelength conversion element, the FED element, and the semiconductor laser light emitting device including the phosphor layer disclosed in the present application are incorporated in lighting, a headlight (HD) for a vehicle, a daytime running light (DRL) for a vehicle, a display, or a projector. Further, the color wheel according to the present invention is incorporated in a projector.

While the present invention has been, described with respect to preferred embodiments thereof, it will be apparent to those skilled in the art that the disclosed invention may be modified in numerous ways and may assume many embodiments other than, those specifically described above. Accordingly, it is intended by the appended claims to cover all modifications of the invention that fall within the true spirit and scope of the invention.

What is claimed is:

1. A wavelength conversion element, comprising:
a plurality of phosphor particles; and
a matrix located among the plurality of phosphor particles, the matrix comprising zinc oxide in a c-axis orientation or single crystalline zinc oxide.

2. The wavelength conversion element according to claim 1, comprising a phosphor layer that comprises the plurality of phosphor particles and the matrix.

3. The wavelength conversion element according to claim 2, further comprising a thin film that is in contact with the phosphor layer and formed of zinc oxide.

4. The wavelength conversion element according to claim 3, further comprising a substrate that is in contact with the thin film,
wherein the thin film is located between the phosphor layer and the substrate, and
wherein the substrate is formed of one selected from the group consisting of glass, quartz, silicon oxide, sapphire, gallium nitride, and zinc oxide.

5. The wavelength conversion element according to claim 2, further comprising a substrate that is in contact with the phosphor layer,
wherein the substrate is formed of one selected from the group consisting of glass, quartz, silicon oxide, sapphire, gallium nitride, and zinc oxide.

6. The wavelength conversion element according to claim 1, wherein a full width at half maximum of a c-axis of the zinc oxide using an X-ray rocking curve method is 4° or less.

7. The wavelength conversion element according to claim 1, wherein the zinc oxide is columnar crystals.

8. The wavelength conversion element according to claim 1, wherein the single crystalline zinc oxide is in the c-axis orientation.

9. The wavelength conversion element according to claim 1, wherein the plurality of phosphor particles comprise at least one selected from the group consisting of an yttrium aluminum garnet (YAG) phosphor and β-SiAlON.

10. An LED element, comprising:
a semiconductor light emitting element for emitting excitation light; and
the wavelength conversion element according to claim 1 into which the excitation light emitted from the semiconductor light emitting element enters.

11. The LED element according to claim 10, wherein the wavelength conversion element is directly formed on the semiconductor light emitting element.

12. The LED element according to claim 10, further comprising a crystal separation layer located between the wavelength conversion element and the semiconductor light emitting element.

13. The LED element according to claim 12, wherein the crystal separation layer is formed of an amorphous material containing silicon dioxide as a main component.

14. The LED element according to claim 13, wherein the crystal separation layer is formed by plasma-enhanced chemical vapor deposition.

15. The LED element according to claim 10, wherein the semiconductor light emitting element comprises:

an n-type GaN layer;

a p-type GaN layer; and a light emitting layer formed of InGaN, the light emitting layer being sandwiched between the n-type GaN layer and the p-type GaN layer.

16. The LED element according to claim 10, wherein the excitation light is light in a wavelength band of blue or blue-violet.

17. The LED element according to claim 16, wherein:

the plurality of phosphor particles comprise a blue phosphor and a yellow phosphor;

the excitation light is the light in the wavelength band of blue-violet; and the blue phosphor emits blue light by exciting the blue phosphor by the excitation light, and the yellow phosphor emits yellow light by exciting the yellow phosphor by the excitation light or the blue light.

18. A semiconductor laser light emitting device, comprising:

a semiconductor laser chip for emitting excitation light; and the wavelength conversion element according to claim 1 into which the excitation light emitted from the semiconductor laser chip enters.

19. The semiconductor laser light emitting device according to claim 18, wherein:

the plurality of phosphor particles comprise a blue phosphor and a yellow phosphor;

the excitation light is the light in the wavelength band of blue-violet; and the blue phosphor emits blue light by exciting the blue phosphor by the excitation light, and the yellow phosphor emits yellow light by exciting the yellow phosphor by the excitation light or the blue light.

20. A vehicle, comprising:

the semiconductor laser light emitting device according to claim 18; and a power supply for supplying electric power to the semiconductor laser light emitting device.

* * * * *